United States Patent [19]

Wycoff

[11] E Re. 28,739

[45] Reissued Mar. 16, 1976

[54] TONE CONTROL CIRCUIT HAVING A FREQUENCY CONTROLLABLE FILTER

[76] Inventor: Keith H. Wycoff, 1205 N. Tyler St., Lexington, Nebr. 68850

[22] Filed: June 11, 1973

[21] Appl. No.: 368,946

Related U.S. Patent Documents

Reissue of:

[64] Patent No.: 3,597,690
Issued: Aug. 3, 1971
Appl. No.: 666,645
Filed: Sept. 11, 1967

[52] U.S. Cl. ..... 325/55; 325/64; 340/171 PF
[51] Int. Cl.[2] ..... H04B 1/04
[58] Field of Search ..... 325/55, 64, 390, 392, 466, 325/478; 340/170, 171 R, 171 A, 171 PF, 311, 312; 343/225, 228

[56] References Cited

UNITED STATES PATENTS

| | | | |
|---|---|---|---|
| 2,523,914 | 9/1950 | Molnar | 325/64 |
| 2,524,782 | 10/1950 | Ferrar et al. | 325/64 X |
| 2,531,416 | 11/1950 | Ferrar | 325/392 X |
| 3,304,501 | 2/1967 | Ruthenberg | 325/64 X |
| 3,336,533 | 8/1967 | Glasser | 325/64 |
| 3,418,577 | 12/1968 | Fischer | 325/64 X |
| 3,670,242 | 6/1972 | McGarvey | 340/171 |

*Primary Examiner*—Benedict V. Safourek
*Attorney, Agent, or Firm*—Prangley, Dithmar, Vogel, Sandler & Stotland

[57] ABSTRACT

A tone control circuit is in a receiver adapted to respond to a sequence of control tones alternately selected from a first group of tones in a first band of frequencies and a second group of tones in a second band of frequencies, wherein the two bands are separated by an intermediate band and wherein the time duration of the gap between adjacent tones in the sequence of tones is substantially zero, the tone control circuit including a filter device which is tuned to the frequencies of the control tones as they are received, a plurality of AND circuits corresponding in number to the control tones and respectively having one input coupled to the filter device and another input coupled to the preceding AND circuit so that each AND circuit is operative to produce an output only in the presence of a tone being passed by the filter and an output signal from the preceding AND circuit, the filter device being tuneable either manually or electronically via the outlet signals from the AND circuits.

65 Claims, 9 Drawing Figures

Inventor
KEITH H. WYCOFF

By

Prangley, Baird, Clayton, Miller & Vogel.
Attys.

TONE CONTROL CIRCUIT HAVING A FREQUENCY CONTROLLABLE FILTER

Matter enclosed in heavy brackets [ ] appears in the original patent but forms no part of this reissue specification; matter printed in italics indicates the additions made by reissue.

The present invention relates to communication systems, and particularly to communication systems for selectively transmitting intelligence from a transmitter to at least one selected receiver.

It is an important object of the present invention to provide in a communication system for selectively transmitting intelligence from a transmitter to at least one selected receiver, the combination comprising a transmitter including a tone-generating circuit for generating tones selected from a first group of tones in a first band of frequencies and for generating tones selected from a second group of tones in a second band of frequencies separate and distinct from the first band of frequencies, the tone-generating circuit generating a sequence of tones alternately selected from from the first and second groups of tones, a transmitter output circuit coupled to the tone-generating circuit for transmitting signals corresponding to the sequence of tones and corresponding to the intelligence to be transmitted, a receiver including an input circuit for receiving the signals from the transmitter, a detecting circuit coupled to the input circuit for detecting the sequence of tones and the intelligence of the signals, a translating circuit coupled to the detecting circuit for translating the intelligence into a useable form, an output control circuit coupled to the translating circuit and effective in a first condition thereof to render the translating circuit inoperative and effective in a second condition thereof to render the translating circuit operative, first and second tone control circuits, the first tone control circuit being coupled to the detecting circuit and to the second tone control circuit and responsive to the application of tones from the first group of tones to provide first control signals to the second control circuit, the second tone control circuit being coupled to the detecting circuit and to the first tone control circuit and responsive to the application of the tones from the second group of tones to provide second control signals to the first tone control circuit, and means for applying an output control signal from the tone control circuits to the output control circuit upon the application of the last tone in the sequence of tones for actuating the output control circuit from the first condition thereof to the second condition thereof, thereby to render the translating circuit operative.

In connection with the foregoing object, it is another object of the invention to provide a communication system of the type set forth wherein the control tones are in the audio range of frequency, each band of frequencies containing at least 10 separate tones with each tone separated from the adjacent tones by about 3⅓ percent of the frequency thereof with instantaneous switching between adjacent tones in the sequence.

Another object of the invention is to provide a communication system of the type set forth wherein the transmitter produces a carrier signal upon which the intelligence and the control tones are applied by modulation, the preferred type of modulation being frequency modulation.

Yet another object of the invention is to provide a communication system of the type set forth wherein each tone in the sequence of tones has a time duration substantially not greater than about 40 milliseconds, and the spacing between adjacent tones in the sequence of tones each has a time duration as short as possible, whereby to provide for rapid receiver turn-on with freedom from false operation.

Still another object of the invention is to provide an improved receiver for use in a communication system of the type set forth.

In connection with the foregoing object, another object of the invention is to provide an improved receiver of the type set forth having therein two tone control circuits each having a tapped filter therein adjustable to a selected one of a plurality of positions respectively corresponding to a selected tone in one of the groups of tones so that upon the application of the selected tone thereto, an output is derived therefrom.

Yet a further object of the invention is to provide an improved receiver of the type set forth wherein the tapped filter has a plurality of connections thereon, the appropriate connection being electronically established thereby to select the response frequency of the tapped filter.

Still another object is to provide an improved communication system compatible with a numbering system (or alphanumeric designation) wherein there will be a large shift in frequency between any pair of successive digits or letters regardless of the number or letter to be selected, all while requiring only a relatively narrow total frequency spectrum.

A still further object of the invention is to provide a receiver of the type set forth wherein the taps selected on the tapped filters, and therefore the frequency of response of the filter, are selected and determined by the connectors interconnecting the tapped filter and the other circuit components of the receiver.

A further object of the invention is to provide an improved tapped filter for use in the receiver of the present invention.

Further features of the invention pertain to the particular arrangement of the elements of the communication system, the receiver therefor, and the components circuits and elements thereof, whereby the above-outlined and additional operating features thereof are attained.

The invention, both as to its organization and method of operation, together with further objects and advantages thereof will best be understood by reference to the following specification taken in connection with the accompanying drawings, in which.

Figure 2:
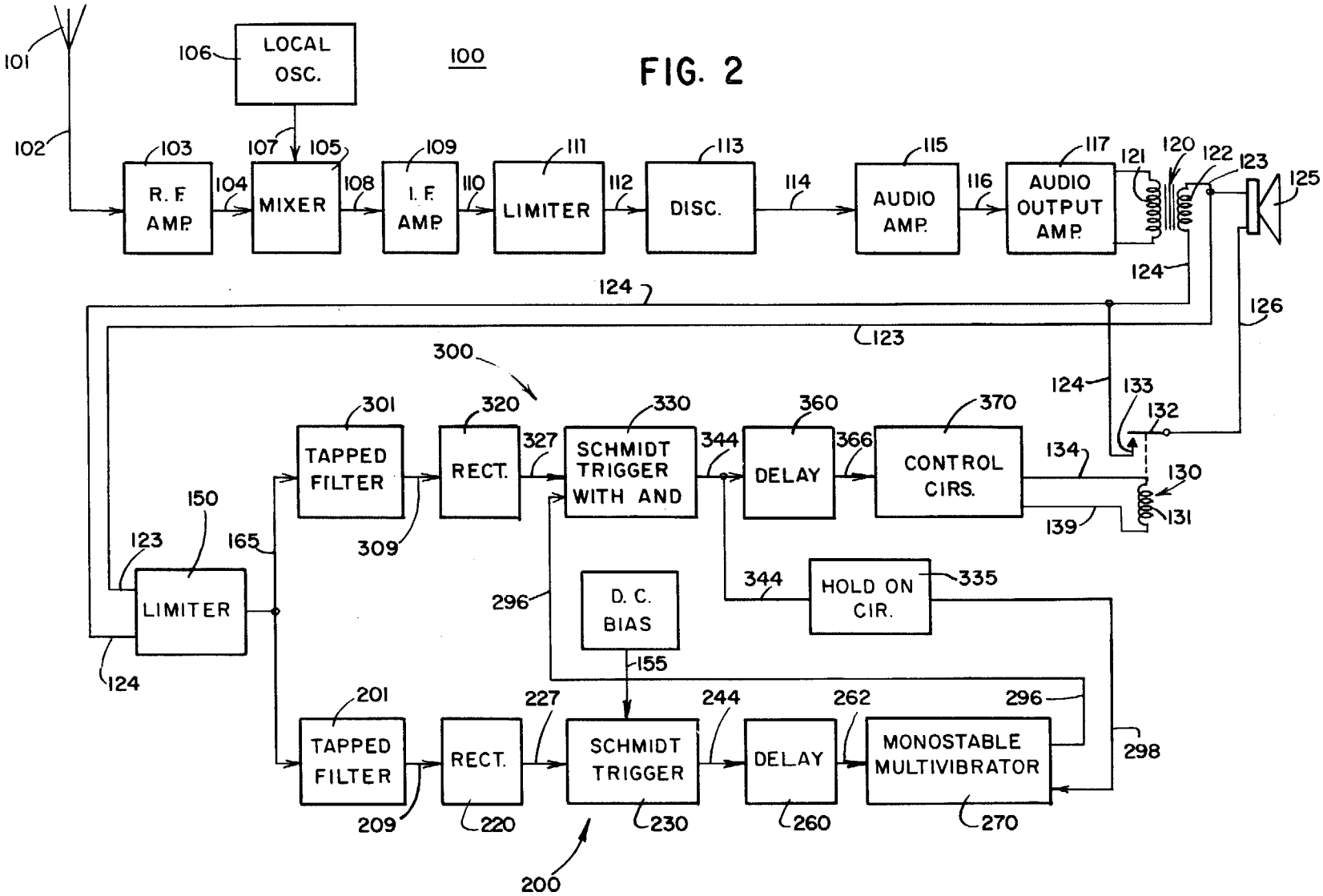
FIG. 2 is a more detailed schematic and block diagram of the receiver forming a part of the communication system of FIG. 1.
Figure 3:
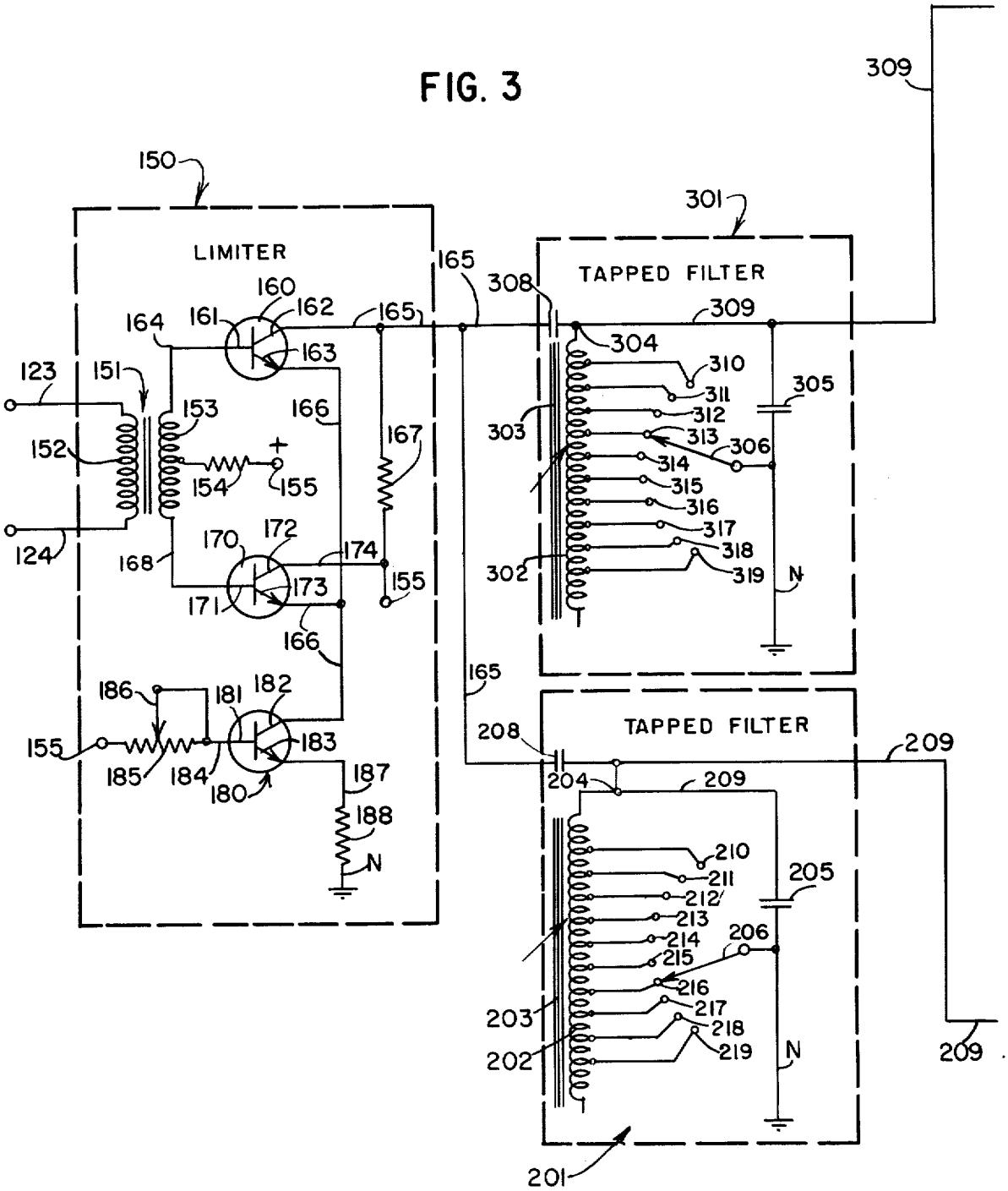
Figure 4:
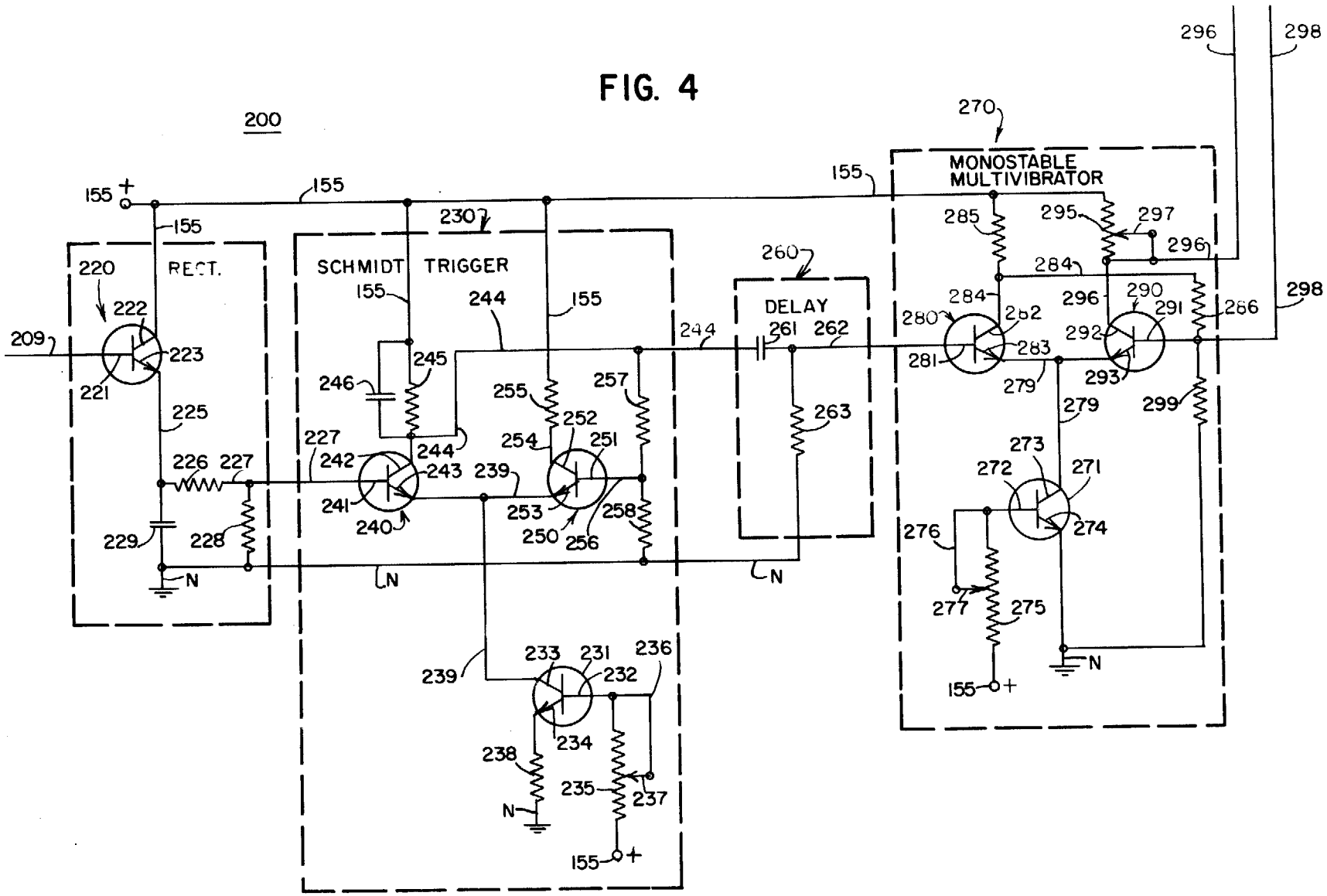
Figure 5:
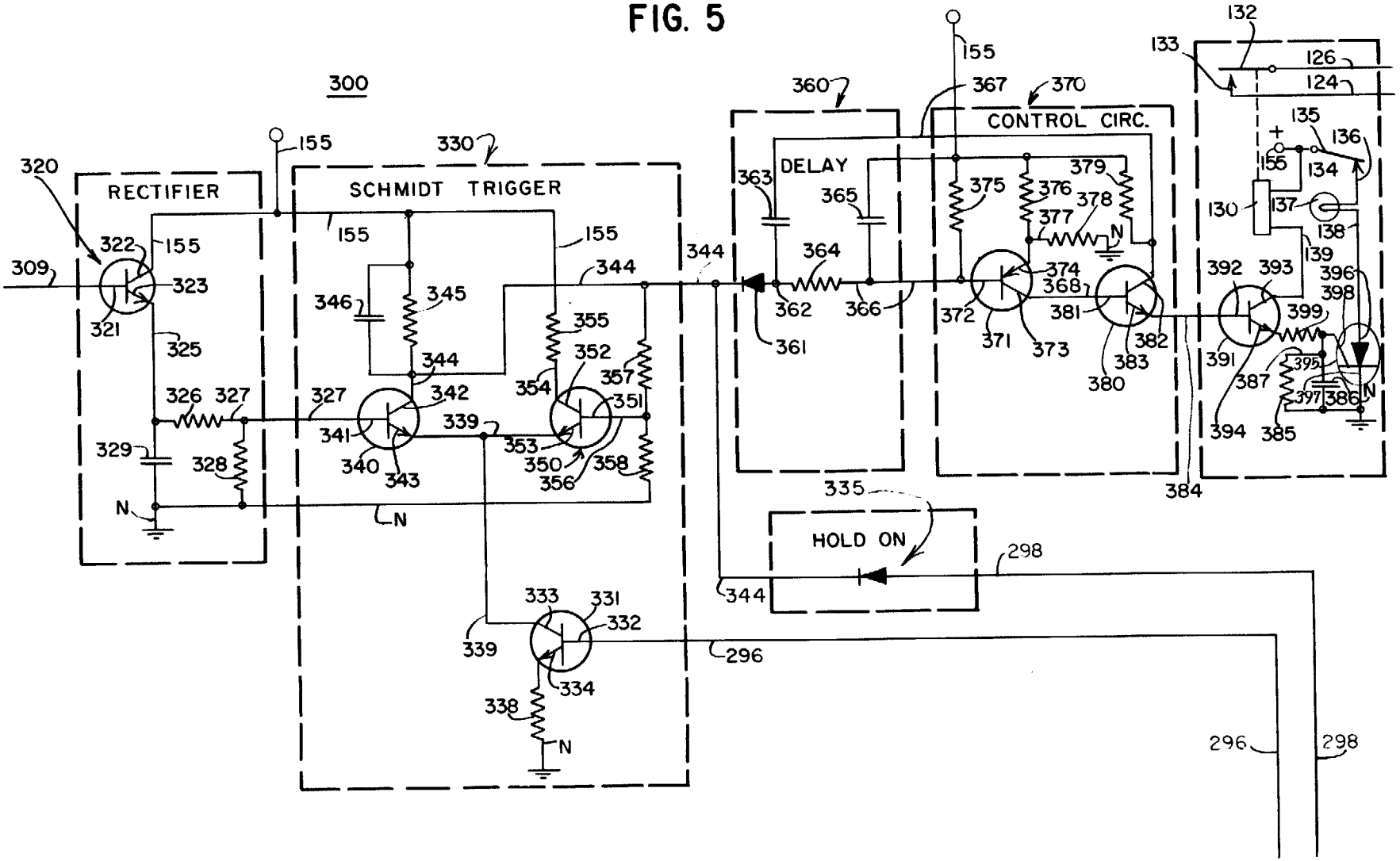
Figure 6:
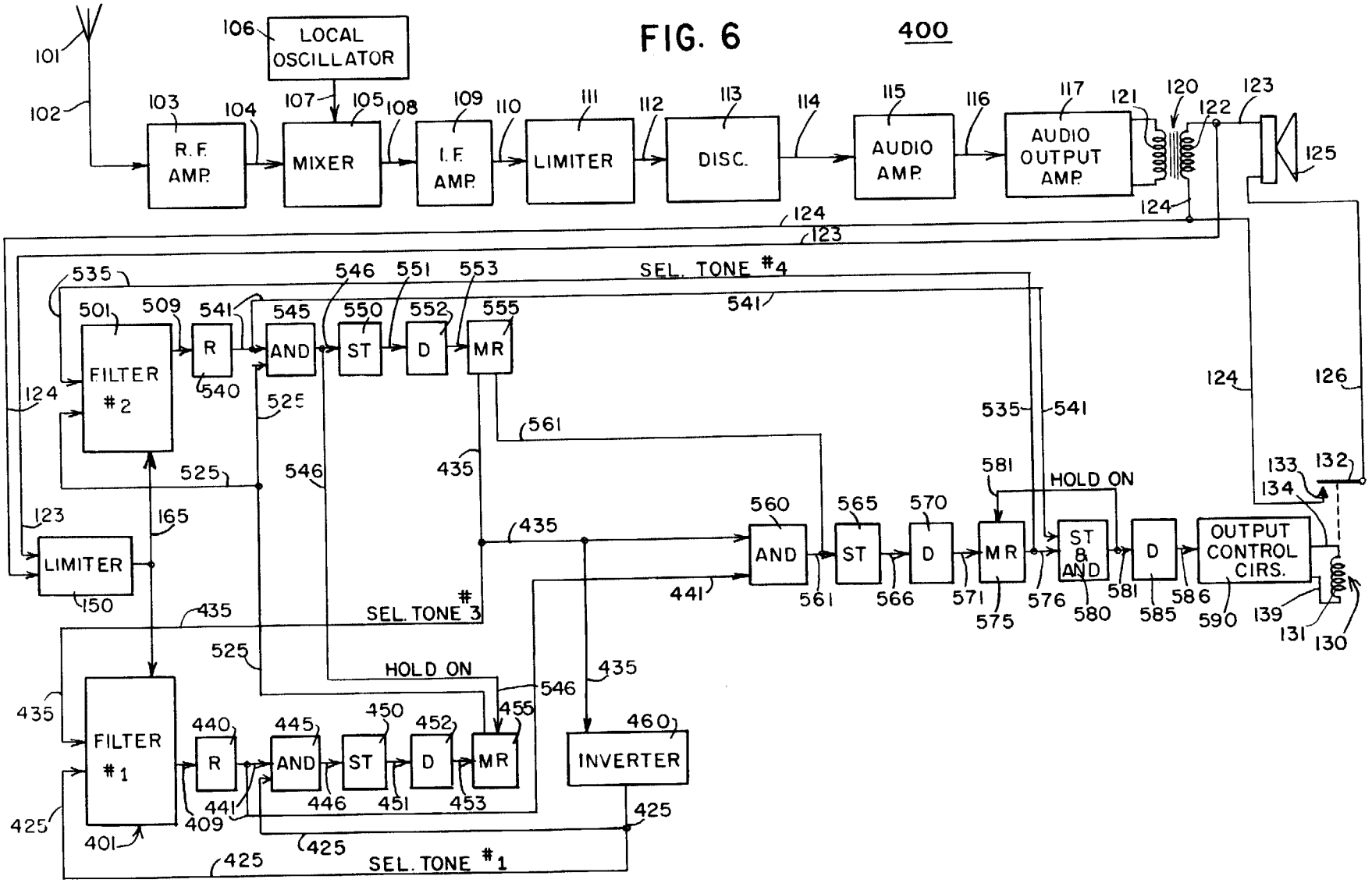
Figure 7:
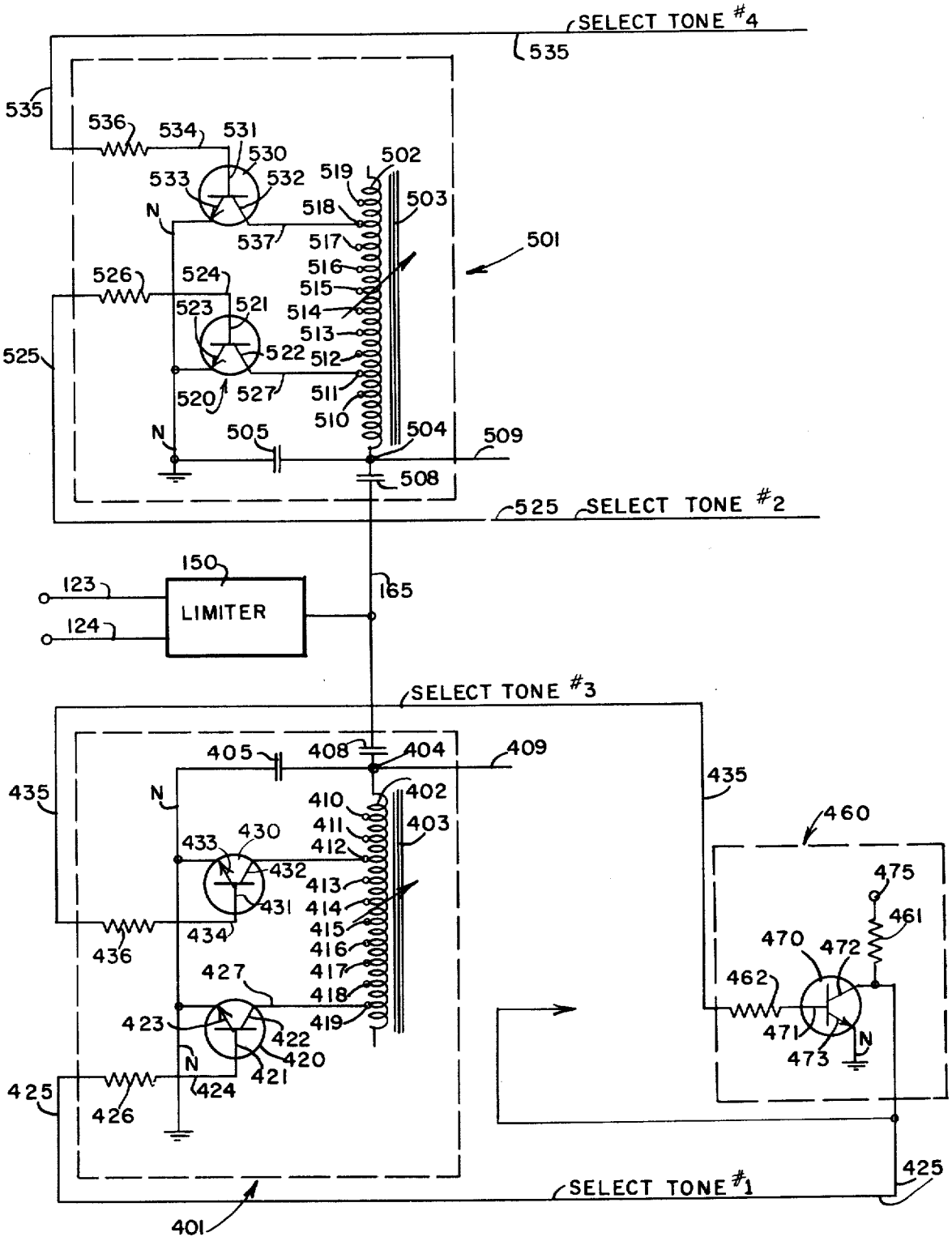
Figure 8:
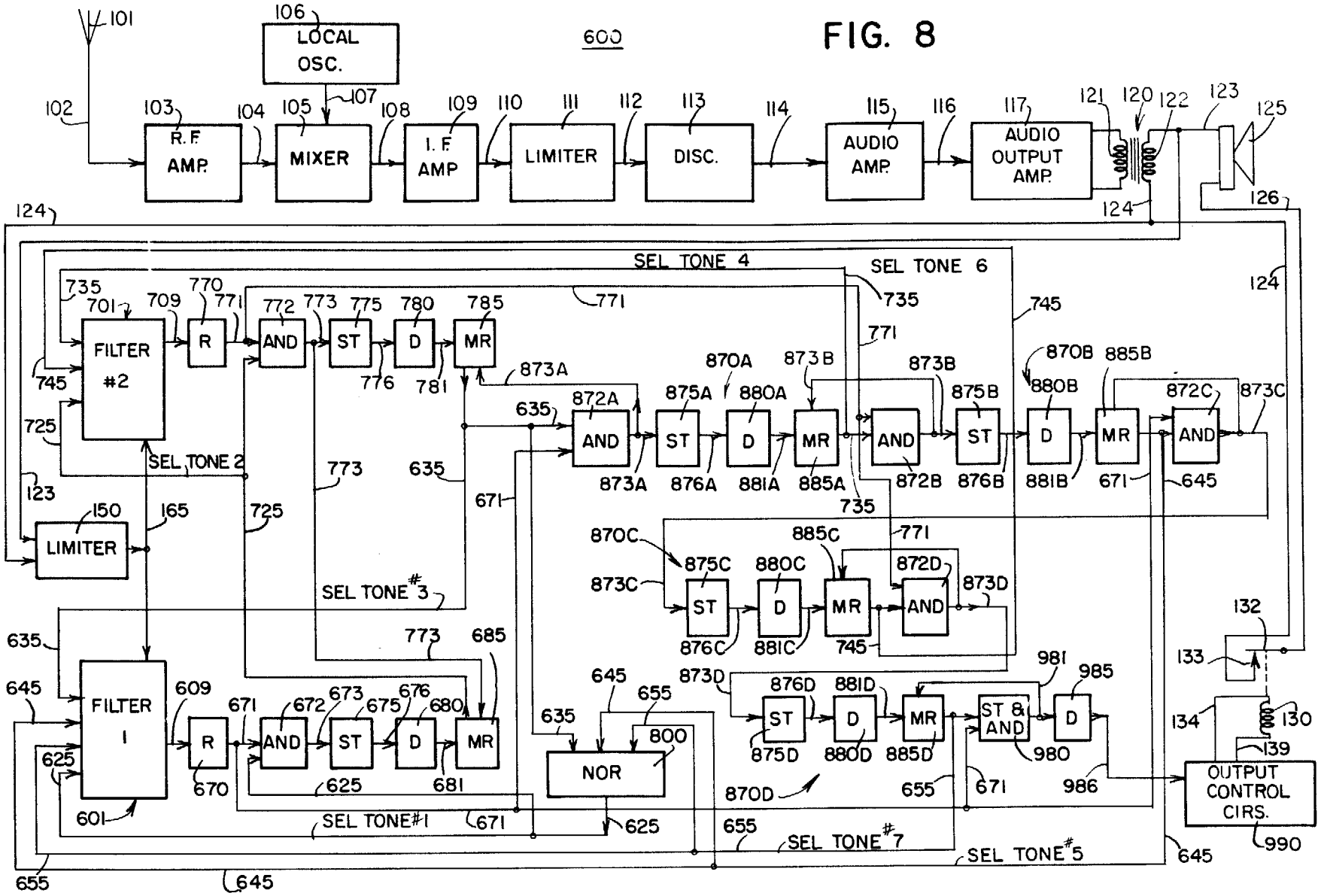
Figure 9:
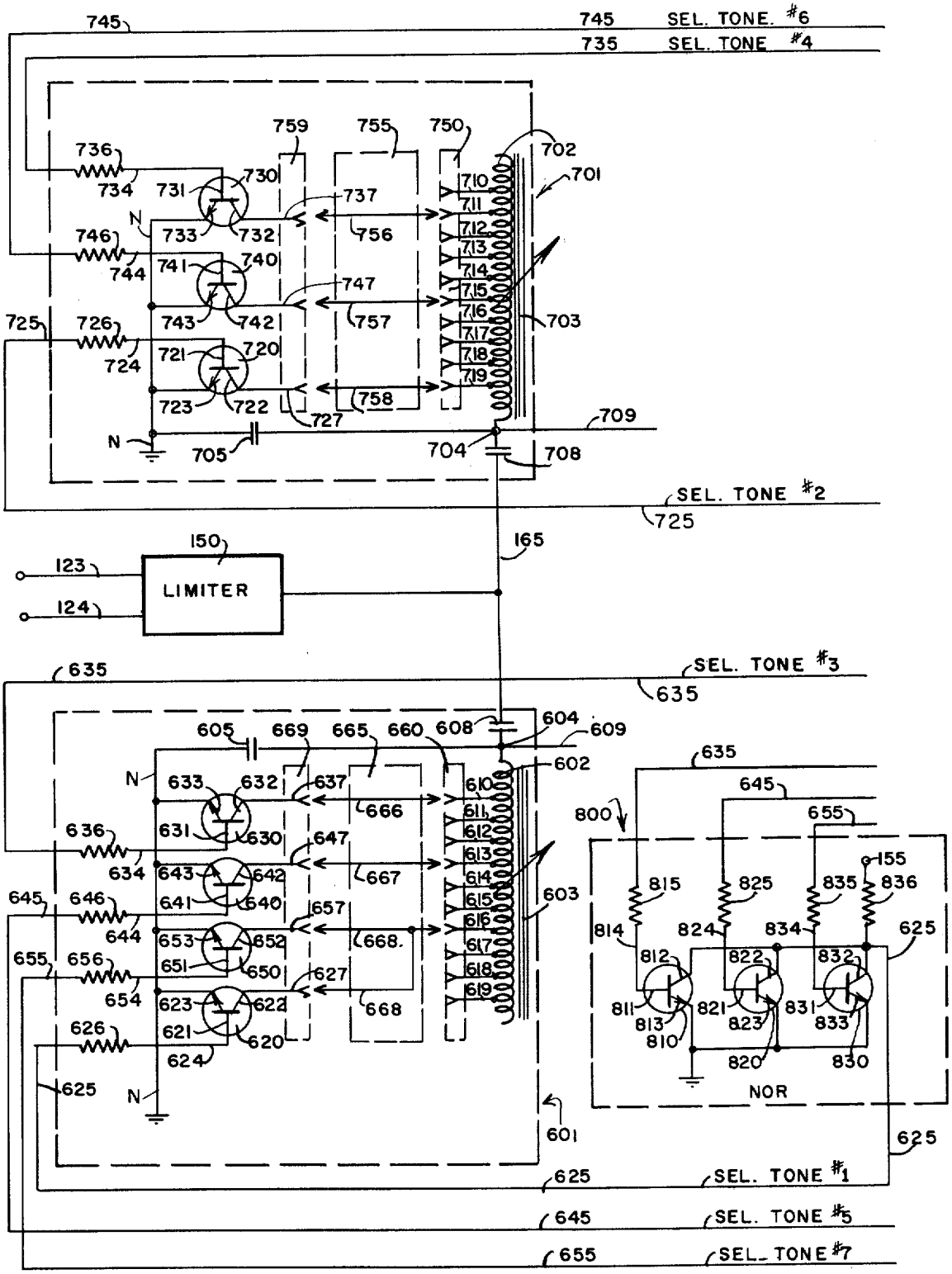

FIGS. 3, 4 and 5, taken together, comprise a schematic electrical diagram of the tone control circuits forming a part of the receiver of FIG. 2;

FIG. 6 is a schematic block diagram of a second form of a receiver made in accordance with and embodying the principles of the present invention;

FIG. 7 is a schematic electrical diagram of the filters and inverter forming a part of the receiver illustrated in FIG. 6;

FIG. 8 is a schematic block diagram of a third form of a receiver made in accordance with and embodying the principles of the present invention; and FIG. 9 is a schematic electrical diagram of the filters and the NOR circuit forming a part of the receiver of FIG. 8.

The principles of the present invention are equally applicable to communication systems utilizing wire lines, modulated supersonic signals, AM radio signals, and FM radio signals. For illustrative purposes, there is shown in the drawings a communication system employing FM radio signals. Those skilled in the art will readily understand that the various principles to be described hereinafter in conjunction with the system employing FM radio signals can be readily adjusted to the other types of communication systems using other forms of transmission such as those set forth above.

Figure 1:
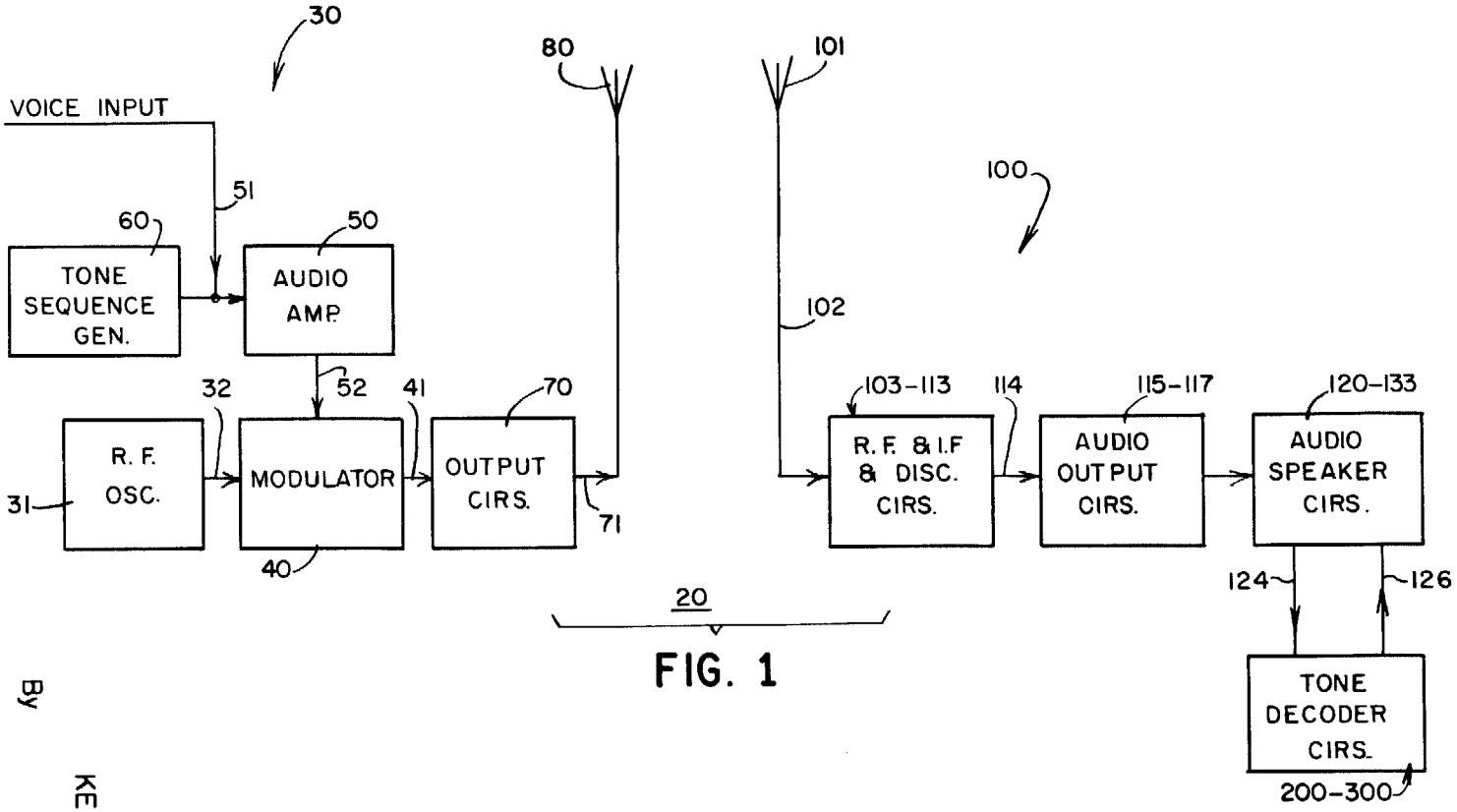
FIG. 1 is a schematic diagram of a communication system made in accordance with and embodying the principles of the present invention, the transmitter and the receiver embodying the system being illustrated in block form.

Referring to FIG. 1 of the drawings, there is shown a mobile FM radio communication system made in accordance with and embodying the principles of the present invention, the system being generally designated by the numeral 20. The system 20 includes an FM transmitter 30 and an FM receiver 100, it being understood that the transmitter 30 and/or the receiver 100 may be either fixed or mobile, each operating system typically containing both a transmitter 30 and a receiver 100.

The transmitter 100 includes the usual RF oscillator 31, the output of which is applied via the conductor 32 to a modulator 40, the modulator 40 serving to impress audio signals upon the RF carrier provided by the oscillator 31 by means of frequency modulation. One of the audio inputs to the modulator 40 is derived from a voice input appearing on a conductor 51 which is applied through an audio amplifier 50 to a conductor 52 serving as an audio input to the modulator 40. There also is provided a tone sequence generator 60, the output of which is connected to the conductor 51 and is applied through the audio amplifier 50 and through the conductor 52 as a second input to the modulator 40. The output of the modulator 40 appears on the conductor 41 which is coupled to the output circuits 70 where power amplification is effected, the output from the circuits appearing on the conductor 71 that is coupled to a transmitting antenna 80, all in the usual construction and arrangement.

The tone sequence generator 60 is of the type that can generate a sequence of tones, for example, a sequence of two tones, three tones, ...seven tones, etc., the tone sequence being preferably generated automatically after being encoded therein. Furthermore, alternate tones in the tone sequence are selected from two different groups of tones in two different bands of audio frequencies. For example, the first, third, fifth, etc. tones would be selected from a first group of tones in a first band of frequencies, while the second, fourth, sixth, etc. tones in the sequence of tones would be selected from a second group of tones in a second band of frequencies separate and distinct from the first band of frequencies. Preferably the two bands of frequencies are separated by a substantial frequency gap from each other. In an illustrative example of a typical system providing 10 tones in each group of tones, the first group of tones would have the following frequencies providing 10 different channels: 1177, 1219, 1261, 1306, 1352, 1400, 1449, 1500, 1533 and 1608; while the second group of tones would have the following frequencies providing 10 different channels: 1980, 2049, 2121, 2196, 2274, 2354, 2437, 2523, 2612 and 2704. It will be noted that each tone is spaced from the adjacent tones in an amount equal to approximately 3⅓ percent of the frequency thereof, while there are five tones missing between the two groups of tones, thus constituting the frequency gap between the nearest adjacent tones in the two groups of tones. In a typical illustration, the odd-numbered tones in the sequence of tones would be selected from the first group of frequencies, while the even-numbered tones in the sequence of tones would be selected from the second group of frequencies. Selecting one tone from each group of tones to provide a two-tone sequence permits 100 different codes, while choosing four tones from one group of tones and three tones from the other group of tones to provide seven tones can provide 10 million different codes. If the frequency groups are reversed in sequence an additional 100, or 10 million codes can similarly be provided for 227-tone sequences. In the tone sequence generator 60, each tone may, for example, have a time duration of 15 to 100 milliseconds, a typical time duration being 30 milliseconds, for a seven-tone sequence or 75 milliseconds for a two-tone sequence, while the time gap between adjacent tones in the sequence should be as short as possible; as a consequence, for a seven-tone sequence, response times as low as 100 milliseconds are available, all while providing greater security against false activation, as will be explained more fully hereinafter.

The transmissions from the transmitter 30 are adapted to be received by the receiver 100 and more particularly by the antenna 101 thereof which is connected by a conductor 102 to the usual RF and IF and detecting circuits 103–113. The output from the circuits 103–113 appears on a conductor 114 which applies an input to the audio output circuit 115–117 that in turn have the output connected as the input to audio speaker circuits 120–133. In accordance with the present invention, no output is obtained from the audio speaker circuits 120–133 unless the tone decoder circuits 200–300 are first operated by a suitable tone sequence, the input to the tone decoder circuits being on a conductor 124 and the output therefrom being on a conductor 126.

There is illustrated in FIG. 2 of the drawings, a more complete diagram of the radio receiver 100 forming a part of the communication system of the present invention. The carrier signal from the transmitter 30 is picked up on the antenna 101 and is conveyed by the conductor 102 to the input of a radio frequency amplifier 103. The output of the radio frequency amplifier 103 is supplied by a conductor 104 as one of the inputs to the mixer 105, the usual local oscillator 106 being provided and having the output thereof connected by a conductor 107 as a second input to the mixer 105. The intermediate frequency which is the output of the mixer 105 is applied by a conductor 108 as the input to the IF amplifier 109, the output of which is transmitted by the conductor 110 to the input of a limiter 111. The output of the limiter 111 appears on a conductor 112 and is the input to the discriminator 113, the output of the discriminator 113 being an audio frequency signal appearing on the conductor 114. The audio signal on the conductor 114 is amplified by an audio amplifier 115 and is then conveyed by a conductor 116 to an audio output amplifier 117. The output from the amplifier 117 is applied to an output transformer 120, and specifically to the primary winding 121 thereof, a secondary winding 122 being provided having one terminal connected by a conductor 123 to one of the input terminals of a loudspeaker 125, and the other terminal being connected to a conductor 124. The conductors 123 and 124 are also connected as an input to the limiter 150 which provides a signal for a first tone control circuit 200 and a second tone control circuit 300. Before there is any output derived from the loud speaker 125, the tone control circuits 200–300 must be activated by a proper sequence of control tones, the output then being applied to a control relay 130 including a coil 131 to which are connected the conductors 134 and 139, respectively. The armature of the relay 130 controls a movable switch contact 132 which cooperates with a fixed switch contact 133 connected to the conductor 124. A conductor 126 interconnects the other input terminal of the loud speaker 125 and the switch contact 132. A proper output from the tone control circuits 200–300 operates the relay 130 to close the contacts 132–133 thereby to connect the loudspeaker 125 across the output terminals of the transformer secondary winding 122, thus to provide an audio output from the receiver 100.

The first tone control circuit 200 has an input thereto a first control tone as the output of the limiter 150 that appears on the conductor 165, the input being a series of pulses of essentially square wave form that are applied as an input to a tapped filter 201, the output of the tapped filter 201 being a sinusoidal wave form appearing on a conductor 209, provided that the frequency of the input pulse is that to which the tapped filter 201 is tuned. The conductor 209 connects to a rectifier 220 which serves to rectify the input and to provide a DC output voltage on a conductor 227 that is connected as one input to a Schmidt trigger circuit 230. Another input to the Schmidt trigger 230 is a suitable bias from a DC voltage that is applied on a conductor 155. The output of the Schmidt trigger 230 is connected by a conductor 244 to a delay circuit 260, and if the DC voltage on the conductor 244 persists for a predetermined period of time, an output is derived from the delay circuit 260 upon cessation of the first control tone. The output of the circuit 260 appears on a conductor 262 that is connected to the input of the monostable multivibrator 270. The multivibrator 270 is effective to produce an output pulse on a conductor 296 which is applied as one of the inputs to the second tone control circuit 300.

The second tone and control circuit 300 has as one of the inputs thereto a second control tone as the output of the limiter 150 that appears on the conductor 165, this input being a series of pulses of essentially square waveform that are applied as an input to a tapped filter 301, the output of the tapped filter 301 being a sinusoidal wave form appearing on a conductor 309, provided that the frequency of the input pulses is that to which the tapped filter 301 is tuned. The conductor 309 connects to a rectifier 320 which serves to rectify the input and to provide a DC voltage on a conductor 327 that is connected as one input to a Schmidt trigger circuit 330. Another input to the Schmidt trigger circuit 330 is the pulse on the conductor 296 from the monostable multivibrator 270 described above. The output of the Schmidt trigger 330 is connected by a conductor 344 to a delay circuit 360, and if the control voltage on the conductor 344 persists for a predetermined period of time, an output is derived from the delay circuit 360 on a conductor 366 that is connected as the input to the control circuits 370 that is sufficient to control 370. The output of the control circuits 370 appears on the conductors 134 and 139 that apply an energizing potential to the relay 130 to connect the loudspeaker 125 to the audio output of the receiver 100 after the proper sequence of tones has been received. There further is provided a holding circuit 335 that has the input connected to the conductor 344 and has the output connected by a conductor 298 as one of the inputs to the monostable multivibrator 270.

Referring to FIG. 3 of the drawings, there is illustrated in detail of portion of the tone control circuits, and specifically the limiter 150 and the two tapped filters 201 and 301. The output from the audio output amplifier 117 is coupled via the output transformer 120 and the conductors 123–124 to the input of the limiter 150, and specifically to the input terminals of a transformer 151. More specifically the transformer 151 has a primary winding 152 and a secondary winding 153, the terminal of the primary winding 152 being connected respectively to the conductors 123–124. The secondary winding 153 is center tapped and has connected to the center-tap one terminal of a limiting resistor 154, the other terminal of the resistor 154 being connected to the conductor 155. It will be understood that the +DC source circuit of which the conductor 155 is the output terminal provides a fixed DC voltage of for example 12 volts positive, the value of the voltage being regulated to a stable value as by a Zener diode, for example.

The upper terminal of the secondary winding 153 is connected as an input to a transistor 160, and particularly to the base 161 thereof, the collector 162 being connected as an output to a conductor 165 and through a resistor 167 to the +12-volt DC conductor 155; and the emitter 163 is connected to a conductor 166. The lower terminal of the secondary winding 153 is connected by a conductor 168 has an input to a second transistor 170, and specifically to the base 171 thereof. The collector 172 is connected by a conductor 174 to the +12-volt DC conductor 155, while the emitter 173 is connected to the conductor 166. There also is provided in the limiter 150 a bias circuit in the form of a transistor 180, the base 181 of the transistor 180 being connected by a conductor 184 to one terminal of a potentiometer 185, the other terminal of the potentiometer 185 being connected to the +12-volt conductor 155, the potentiometer being provided with the usual arm 186 having one end connected to the conductor 184 and the other end contacting an adjusted point on the resistive member of the potentiometer 185. The collector 182 is connected to the conductor 166, while the emitter 183 is connected by a conductor 187 to one terminal of a resistor 188, the other terminal of the resistor 188 being grounded as at N.

The output from the limiter 150 is a train of essentially square waves appearing on the conductor 165, the train of square waves being coupled to the filter 201 and 301 by the conductor 165.

Considering now the construction of the tapped filter 201, there is provided an input capacitor 208 and an inductor in the form of a coil 202 having associated therewith a magnetic core 203, at least a portion of the core 203 being movable and adjustable, whereby the inductor 202 can be slug tuned. The inductor 202 has an input terminal 204 that is connected by a conductor 209 to one terminal of a capacitor 205, the other terminal of the capacitor 205 being grounded as at N, the output being on the conductor 209. As illustrated, the inductor 202 has a plurality of taps thereon, and specifically 10 taps that are connected to contacts numbered 210 through 219. Associated with the contacts is a movable contact arm 206 which is also grounded via the conductor N. The series of resonance impedance of the filter 201 can be readily changed by moving the contact arm 206 from one contact to another, whereby to change the frequency at which the parallel circuit consisting of the tapped coil 202 and the capacitor 205 become series resonant with the capacitor 208. At resonance the output from the filter 201 will be a maximum and the output will be sinusoidal.

The construction of the tapped filter 301 is identical to that of the tapped filter 201, whereby like reference numerals in the 300 series have been applied to like parts thereof, and in the interest of brevity, no further description of the tapped filter 301 will be given, except to point out that the output therefrom is a sinusoidal wave on the conductor 309, and that the output will be a maximum when the audio input pulse rate is at the frequency to which the output filter 301 is tuned.

Referring to FIG. 4 of the drawings, there is illustrated the details of the construction of the remainder of the first tone control circuit 200. The sine wave on the conductor 209 is applied as an input to the rectifier 220, the rectifier 220 more specifically being a transistor having a base 221 to which the conductor 209 is connected. The collector 222 of the transistor 220 is connected to the +12-volt DC conductor 155, while the emitter 223 is connected by a conductor 225 to a voltage divider network including resistors 226 and 228 connected in series to ground potential as at N, the adjacent terminals of the resistors 226–228 being connected by a conductor 227. A filtering capacitor 229 is connected between the conductor 225 and the ground potential and in parallel with the series resistors 226–228.

The output from the rectifier 220 is a DC voltage appearing on the conductor 227 which is applied as one of the inputs to the Schmidt trigger circuit 230, and specifically to a transistor 240 therein, the base 241 of the transistor 240 being connected to the conductor 227. The collector 242 of the transistor 240 is connected via a conductor 244 and a resistor 245 to the +DC conductor 155, a capacitor 246 being provided in parallel with the resistor 245; while the emitter 243 is connected by a conductor 239 to a bias transistor 231 and to another transistor 250.

The bias transistor 231 has the base 232 thereof connected by a potentiometer 235 to the +DC conductor 155, the potentiometer 235 being provided with a movable contact 237 having one terminal thereof connected by a conductor 236 to the base 232 and having the other terminal thereof in sliding adjusted engagement with the resistive element of the potentiometer 235. The collector 235 is connected to the conductor 239, while the emitter 234 is connected through a resistor 238 to ground potential as at N.

The transistor 250 has a base 251 that is connected by a conductor 256 to one terminal of a resistor 257 and to one terminal of a resistor 258, the other terminal of the resistor 257 being connected to the conductor 244, while the other terminal of the resistor 258 is connected to ground potential as at N. The collector 252 of the transistor 250 is connected via a conductor 254 and a resistor 255 to the +DC conductor 155, while the emitter 253 is connected to the conductor 239.

The output from the Schmidt trigger circuit 230 is a DC voltage appearing on the conductor 244 that provides an input to the delay circuit 260 which comprises a capacitor 261 and a resistor 263 interconnected by a conductor 262. More specifically, one terminal of the capacitor 261 is connected to the conductor 244 and the other terminal thereof is connected to the conductor 262, and one terminal of the resistor 263 is connected to the conductor 262 and the other terminal thereof is connected to ground potential as at N.

The output from the delay circuit 260 is a voltage pulse appearing on the conductor 262 that is applied as one of the inputs to the monostable multivibrator 270, and specifically to the input transistor 280 thereof. The transistor 280 has the base 281 thereof connected to the conductor 262, has the collector 282 thereof connected via a conductor 284 and a resistor 285 to the +DC conductor 155, and has the emitter 283 thereof connected to a conductor.

A bias transistor 271 is provided to apply suitable bias to the transistor 280 and a second transistor 290 in the monostable multivibrator 270. The transistor 271 has a base 272 that is connected through a potentiometer 275 to the +DC conductor 155, the potentiometer 275 having a movable contact 277 bearing against the resistive element thereof, which contact 277 is connected by a conductor 276 to the base of 272. The transistor 271 also has a collector 273 connected to the conductor 279 and an emitter 274 connected to the ground conductor N.

The transistor 290 has the base 291 thereof connected to a conductor 298 that is in turn connected to the adjacent terminals of resistors 286 and 299, the other terminal of the resistor 286 being connected to the conductor 284 and the other terminal of the resistor 299 being connected to the grounded conductor N; the transistor 290 also has a collector 292 connected via a conductor 296 and a potentiometer 295 to the +DC conductor 155, and an emitter 293 connected to the conductor 279. The potentiometer 295 is provided with the usual contact arm 297 in sliding contact with the resistive element of the potentiometer 295, the contact arm 297 being connected to the conductor 296. The output from the monostable multivibrator 270 appears on the conductor 296 as a positive going voltage pulse upon the removal of the first control tone from the receiver 100 provided the first tone has been present for a period longer than a minimum delay period determined by the time constants of delay circuit 260.

Referring next to FIG. 5 of the drawings, there is illustrated in detail the remaining portions of the tone control circuit 300. The sinusoidal wave form corresponding to the selected second tone appears on the conductor 309 and is applied as an input to the rectifier 320, the rectifier 320 being in the form of a transistor having a base 321 to which the conductor 309 is connected. The transistor 320 further has a collector 322 being connected to the +DC conductor 155, and an emitter 323 connected via a conductor 325, a resistor 326, a conductor 327 and a resistor 328 to the grounded conductor N, a capacitor 329 being connected in parallel with the resistors 326 and 328.

The output from the rectifier 320 appearing on the conductor 327 as +DC voltage that is applied as an input to the Schmidt trigger circuit 330 including a bias transistor 331 and a pair of transistors 340 and 350. The bias transistor 331 has a base 332 to which is connected the conductor 296 carrying the output from the monostable multivibrator 270. The transistor 331 has a collector 333 connected to a conductor 339 and an emitter 334 connected by a resistor 338 to the grounded conductor N.

The transistor 340 has a base 341 to which is connected the conductor 327 carrying the DC tone rectifier output as an input to the Schmidt trigger circuit 330. The transistor 340 has a collector 342 that is connected via a conductor 344 and a resistor 345 to the +DC conductor 155, a capacitor 346 being connected in parallel with the resistor 345; and an emitter 343 that is connected to the conductor 339.

The transistor 350 has a base 351 that is connected by a conductor 356 to adjacent terminals of two resistors 357 and 358, the other terminal of the resistor 357 being connected to the conductor 344 and the other terminal of the resistor 358 being connected to the grounded conductor N. The transistor 350 also has a collector 352 connected via a conductor 354 and a resistor 355 to the +DC conductor 155 and an emitter 353 connected to the conductor 339.

The output from the Schmidt trigger circuit 330 appears on the conductor 344 as a negative going voltage, the output being applied to the HOLD ON circuit 355 and the delay circuit 360. As illustrated, the HOLD ON circuit 355 is in the form of a diode having one terminal connected to the conductor 344 and the other terminal connected to the conductor 348 to provide a holding potential for the monostable multivibrator 270.

The input to the delay circuit 360 is applied to one terminal of the diode 361. The other terminal of the diode 361 is connected by a conductor 362 to one terminal of a charging capacitor 363, and one terminal of a resistor 364, the other terminal of resistor 364 being connected by a conductor 366 to one terminal of a capacitor 365, the other terminal of the capacitor 365 being connected to the +DC conductor 155.

The control circuit 370 contains two transistors 371 and 380, the transistor 371 being of the PNP type, whereas all of the other transistors described heretofore, and including transistor 380, are of the NPN type. The transistor 371 has a base 372 to which is connected the conductor 366, the base 372 also being connected through a resistor 375 to the +DC conductor 155. The collector of the transistor 371 is connected by a conductor 368 to the base 381 of the transistor 380, and the emitter 374 of the transistor 372 is connected by a conductor 377 to the adjacent terminals of a pair of resistors 376 and 378, the other terminal of the resistor 376 being connected to the +DC conductor 155 and the other terminal of the resistor 378 being connected to the grounded conductor N. The collector 382 of the transistor 380 is also connected to the +DC conductor 155 through a resistor 379 and is connected by the conductor 367 to one terminal of the capacitor 363. The emitter 383 of the transistor 381 is connected by a conductor 384 as the input to a transistor 391.

The conductor 384 more specifically connects to the base 392 of the transistor 391, the transistor 391 controlling the conduction of current through the control relay 130 that has been described above, the conductor 139 being connected to the collector 393 of the transistor 391. The emitter 394 of the transistor 391 is connected to ground potential via a resistor 399, a conductor 387, and a resistor 385, a capacitor 386 being connected in parallel to the resistor 385. The other connection for the relay 130, namely the connector 134, is connected to the +DC conductor 155. Arranged in parallel with the relay 130 is a "push to reset light" 137 having one terminal connected by a conductor 136 through a switch 135 to the +DC conductor 155, and having the other terminal connected via a conductor 138 to one of the power terminals of a silicon-controlled rectifier (SCR) 395, specifically to the power terminals 396 thereof, the other power terminal 397 being grounded. A control terminal 398 is provided for the SCR 395 and is connected to the conductor 397.

Considering now the operation of the receiver 100, in order to obtain an output from the loudspeaker 125, a two-tone sequence of control tones must be applied to the receiver 100, each tone preferably having a time duration of at least about 15 milliseconds without any gap therebetween. Furthermore, the first tone received must be that to which the tapped filter 201 is tuned, and the second tone received must be that to which the tapped filter 301 is tuned. Upon the reception of the first tone, an audio signal corresponding to the first tone is applied along the conductors 123–124 as an input to the limiter 150. The transistors 160–170 provide in essence a differential amplifier, the total current that can flow through the transistors 160–170 being that which flows through the transistor 180 which is in turn controlled by the setting of the potentiometer 185. The potentiometer 185 is adjusted so that the current through the transistor 180 is not sufficient to allow one of the transistor 160–170 to be driven to saturation when the other is nonconducting. The incoming control tone on the conductors 123–124 alternately increases the conduction of one of the transistors 160–170 and decreases to cut off the conduction of the other, the conduction through the conducting transistor 160–170 being limited by the conduction through the transistor 180. Therefore the output on the conductor 165 is a square wave whenever the amplitude of the incoming audio signal is more than a certain minimum determined by the gain of the limiter 150 and the adjustment of limiting level by the potentiometer 175. Assuming that the amplitude of the first control tone appearing at the input of the limiter 150 is sufficient to cause limiting a square wave output is provided on the conductor 165. It is pointed out that once the limiter 150 operates, the filter control band width will be constant if the limiter is symmetrical, i.e., if the circuits for the transistors 160 and 170 are balanced and symmetrical. An important feature of the limiter 150 resides in the fact that with a carefully controlled DC bias potential on the conductor 155 such as that provided by a Zener diode supply, there is no change of the band width as a result of a change in the amplitude of the incoming tone control signal, since above limiting, the voltage level to the output tone filters will be constant. When the amplitude of the incoming signal is below the limiting level, the band width will narrow; however this narrowing portion will be very small. By adjusting the limiting level of the limiting amplifier 150 by means of the slider 186, the maximum band width can be readily adjusted.

The series of square wave pulses on the conductor 165 are then applied to the tapped filters 201 and 301 and assuming that the control 206 is positioned so as to be at resonance for the first tone voltage, the output at the conductor 209 will be a sinusoidal wave having a frequency equal to that of the first control tone. It is pointed out that the tapped filter 201 responds to the selected one of the 10 tones in the first group of tones that are all disposed in a first band of frequencies extending from 1,177 cycles per second to 1,608 cycles per second, while the tapped filter 301 responds to the elected one of the ten tones in the second group of tones that are disposed in a second band of frequencies extending from 1,980 cycles per second to 2,704 cycles per second. It is further pointed out that when the band width for a single tone is adjusted as a percentage of its resonant frequency by slug tuning of the inductors 202 or 302, as the case may be, the percentage of band width remains constant for all other taps. This results from the fact that the frequency of an LC circuit varies directly with the number of turns on the coil and because the Q also varies in a fashion such as to hold the band width as a constant percentage of the particular frequency selected. This results in substantial savings in manufacturing costs since a single frequency or band width adjustment adjusts the band width for all frequencies. Stating the matter in another way, in the resonant circuit such as the tapped filter 201, when the capacitance of the capacitors 208 and 205 are held constant and the inductance of the inductor 202 is varied, by the tap selection, the Q varies proportionately to the number of effective turns used in the inductor 202, the resonant frequency varies inversely as the number of effective turns in the inductor 202, and the Q varies proportionately to the frequency. If the resonant frequency is varied by changing the number of effective turns on the inductor 202, the circuit Q will remain constant at resonance for each selected frequency, i.e., if the turns are doubled, the resonant frequency will be halved while the Q will be doubled by the turns increase at the same frequency but halved by the frequency change, thereby to leave the Q unchanged. The voltage as a percentage of the peak voltage gives a band width which is a predetermined percentage of the resonant frequency for any given Q. If Q is held constant, as explained above, the band width will remain a constant percentage of the resonant frequency as the resonant frequency is varied, for example +2 percent preferred channel separation is that wherein the spacing between adjacent frequencies is a uniform percentage of resonance, the 3⅓ percent spacing, for example referred to previously.

The sinusoidal wave corresponding in frequency to the first control tone is applied along the chamber 209 as the input to the rectifier 220, and there appears as the output from the rectifier 220 a positive going voltage on the conductor 227 that is applied as an input to the Schmidt trigger circuit 230.

Before the application of the input along the conductor 227 to the Schmidt trigger circuit 230, the bias transistor 231 is conducting to establish a bias on the emitters of the transistor 240 and 250, the amount of bias being adjustable by means of the potentiometer 235, whereby the potentiometer 235 serves as the band width adjustment for the first control tone. Initially the transistor 240 is nonconducting and the transistor 250 is conducting. Upon the application of the positive voltage along the conductor 227 to the base of the transistor 240, the transistor 240 begins to conduct and quickly drives the transistor 250 to a nonconducting condition, the potential on the conductor 244 that is applied to the base 251 of the transistor 250 rapidly dropping. After a suitable time delay as determined by the time constant characteristics provided by the capacitor 261 and the resistor 263 and upon cessation of the first tone, an input is applied to the monostable multivibrator 270 along the conductor 262.

Prior to the application of the first control tone to the first control circuit 200, the biasing transistor 271 is conducting in an amount determined by the adjustment of the potentiometer 275 and applies a bias along the conductor 279 which serves to render the transistor 280 nonconducting and the transistor 290 conducting. Upon the application of the first control tone to the receiver 100 the voltage on the conductor 244 drops as explained above and the capacitor 261 begins to charge at a rate determined by the value of the capacitor 261 and the resistor 263. If the charge time of the capacitor 261 is sufficient, when the potential on the transistor 244 returns to the high potential of the capacitor 261 it will supply a voltage to the base 281 of the transistor 280 that will exceed the voltage at the collector 273 of the transistor 271. In other words, the transistor 281 is rendered conducting by a positive pulse from the delay circuit 260 which exceeds the potential on the conductor 279 that is established by the adjustment of the potentiometer 275, and at the same time the transistor 290 is rendered nonconducting, thereby to provide a positive pulse output on the conductor 296, the potential on the conductor 296 rising to the DC voltage on the conductor 155 (less any voltage drop in the potentiometer 295 caused by condution of the second tone circuit 300).

The initial low bias on the conductor 296 is applied to the base 332 of the transistor 331 of the Schmidt trigger circuit 330 of the second control circuit 300, thereby to render the transistor 331 nonconducting which in turn renders the transistor 340 nonconducting and the transistor 350 nonconducting, whereby the output of the second tone control circuit is blocked prior to the reception of the first control tone and for so long as the first control tone persists. Upon the removal of the first control tone from the input to the first tone control circuit 200, the conditions described above in the first control circuit are essentially reversed, whereby the high positive potential on the conductor 296 rapidly rises as the transistor 290 is blocked and the adjustment of the potentiometer 295 in effect adjusts the band width of the second tone control circuit 300.

Upon the removal of the first control tone and the accompanying rise in potential on the conductor 296, the transistor 331 begins to conduct, the transistor 340 is continued in a nonconducting condition, while the transistor 350 begins to conduct. Now the second tone control circuit 300 is ready to receive the second control tone.

Assuming now that a proper second control tone is applied to the receiver 100 and passes through the limiter 150 and the tapped filter 301, there is provided on the conductor 309 a sinusoidal wave form having the frequency of the second control tone. This input is applied to the rectifier 320 thereby to produce a positive going output on the conductor 327 that is applied to the base of the transistor 340 in the Schmidt trigger circuit 330.

As has been described heretofore, at this point in the operation of the system, the transistor 340 is nonconducting while the transistor 350 is conducting, whereby upon the application of the positive going voltage along the conductor 327 to the base 341 of the transistor 340, the transistor 340 is rendered conductive. Upon heavy conduction of the transistor 340, the heretofore relatively high potential on the conductor 344 rapidly drops and this drop in potential in the form of a negative going voltage is applied to the base of the transistor 350 to render the transistor 350 nonconducting, and the signal is also applied as an input to the delay circuit 360. The capacitors 363 and 365 now begin to charge and after a predetermined time as determined by the time constant characteristics of the delay circuit 360 (for example 40 milliseconds), a potential is reached on the conductor 366 which will render the transistor 371 conductive to provide a positive going pulse on the conductor 368. The transistor 380 acts as a current amplifier and amplifies the positive going pulse applied to the base thereof and in turn applies a positive going pulse to the base of the transistor 391. The output from the transistor 391 is a positive going pulse that is applied to the gate 398 of the SCR 395, thereby to cause heavy conduction thereof to light the indicating light 137. Heavy conduction of the transistor 391 also operates the relay 130 to close the switch contacts 132–133, thus to apply the output of the transformer 120 to the loudspeaker 125 via the conductors 123 and 126. The relay 130 will be energized for a short period determined by the time which the transistor 391 is conducting. The relay 130 and the lamp 137 could be interchanged in their connection in the circuit if desired, depending upon the control requirements. The relay 130 could be used for any control purpose desired. Once the SCR 395 is conducting, it will remain conducting until the switch 135 is opened, and such conduction will maintain the light 137 in the energized condition.

It is further pointed out that upon receiving the second control tone so as to provide the negative going voltage on the conductor 344, a pulse is transmitted via the holding circuit 395 and the conductor 298 to the monostable vibrator 270 to hold the multivibrator 270 in a condition such that the Schmidt trigger circuit 330 will continue to be held in a condition to transmit the signals generated by the second control tone. In this manner it will be appreciated that the Schmidt trigger 330 also serves as an AND circuit wherein the output from the first tone control circuit 200 must be applied thereto before the application of the second control tone output from the rectifier 320 is effective.

Further the feedback of the HOLD ON voltage permits the second tone to continue for as long as desired, so long as it appears soon enough after the first tone period to cause the hold on voltage to be generated, thereby controlling the multivibrator 270 in the "on" condition. The multivibrator 270 may, for example, be on for only 15 or 20 milliseconds in the absence of a HOLD ON voltage. During this period, control tone two must be applied, and the filter output must rise to a voltage sufficient to produce the HOLD ON voltage.

An important feature of the tone control circuit of the receiver 100 resides in the freedom from falsing, i.e., the freedom from operation by false and spurious signals that may be applied as an input thereto. The freedom from falsing results from several factors. First, by utilizing the tone filter circuitry (including the limiter 150, the tapped filters 201–301, the rectifiers 220–330) having the characteristics as described; there positively can be no response to signals that lie out of the filter band pass, regardless of the false signal duration or intensity. Second, by requiring that subsequent tones in a tone sequence be spaced apart in frequency by several tone channels, together with requiring substantially instantaneous switching between successive tones, a signal of smoothly varying pitch such as might be produced by a heterodyne circuit, a siren near a microphone or like source, cannot actuate the tone control circuits, this resulting from the fact that the tone control circuits require a sudden jump or change in frequency between successive tones.

It is further pointed out that the described tone control circuit is readily adaptable to and compatible with a decimal numbering system, at 10 different frequencies in each group of tones corresponding to and representing the 10 different digits, with successive tones being selected alternately from the two groups of tones. If only 10 frequencies were utilized (rather than the 20 frequencies of the present system), to represent the 10 digits, i.e., with no change or jumping between bands of frequencies on successive digits, it would not be possible to utilize codes such as 22, 55, etc., in two-tone sequence systems. Although it has been suggested that an 11th tone be utilized as a repeat tone in such sequence, the frequency spectrum utilized if five channels are to separate adjacent tones would be substantially greater than that required for the present system, and the circuitry would be substantially more complicated. It is pointed out that utilizing this present system wherein alternate tones are selected from two groups of tones wherein the groups are separate at a minimum gap of five tones, only a 25-channel spectrum is required to produce any pair of digits in sequence while still maintaining a minimum gap of five channels therebetween.

Referring now to FIG. 6 of the drawings, there is illustrated a second embodiment of the present invention wherein a sequence of four tones is required to actuate the receiver, the receiver being designated by the numeral 400 and being illustrated in schematic and block diagram form. The receiver 400 utilizes the input circuits and components from the antenna 101 through the limiter 150 and onto the conductor 165, from the receiver 100, whereby the same reference numerals have been applied to these components and the description thereof will not be here repeated in the interest of brevity.

The output of the limiter 150 on the conductor 165 is fed to two-tone control circuits, the lower tone control circuit including a special tapped filter 401 identified by the legend FILTER # 1 of a construction to be described hereinafter, the input to the filter 401 being a series of square waves and the output thereof appearing on a conductor 409 in the form of a sinusoidal wave having a frequency of the selected control tone. The conductor 409 connects to a rectifier 440 which serves to rectify the input thereto and which has the same construction as the rectifier 220 described above. The output from the rectifier 440 is a positive voltage that is supplied along a conductor 441 as one of the inputs to an AND circuit 445. The output from the AND circuit 445 appears on a conductor 446 that is connected to the input of a Schmidt trigger circuit 450, the AND circuit 445 and the Schmidt trigger circuit 450 having the construction of the Schmidt trigger circuit 330 described above. The output from the Schmidt trigger circuit 450 is connected by a conductor 451 to a delay circuit 452 of the same construction as the delay circuit 260, and the output from the delay circuit 452 is connected by a conductor 453 as one input to a monostable multivibrator 455 of the construction described above with respect to the monostable multivibrator 270. The output from the multivibrator 455 appears on a conductor 525 that connects into the upper tone control channel. Also associated with the lower tone control channel is an inverter 460 having an input thereto from a conductor 435 and having an output on a conductor 425 that connects as an input to the filter 401, and to provide the second input to the AND circuit 445.

The upper tone control channel includes a special tapped filter 501 identified as FILTER # 2 also to be described more fully hereinafter, one of the inputs to the filter 501 being from the conductor 525 and another being from the conductor 165. The output from the filter 501 appears on a conductor 509 connected to a rectifier 540 of the same construction as the rectifier 320 described above. The output from the rectifier 540 is on a conductor 541 that supplies one input to an AND circuit 545, the output of which appears on a conductor 546 connected as an input to a Schmidt trigger circuit 550; the AND circuit 545 and the Schmidt trigger circuit 550 together having the construction of the Schmidt trigger circuit 330 described above. The output from the Schmidt trigger circuit 550 appears on a conductor 551 and is supplied as an input to a delay circuit 552 having the construction of the delay circuit 260 described above. The output from the delay circuit 550 appears on a conductor 553 and is an input to a monostable multivibrator 555 having a construction like the monostable multivibrator 270.

The outputs on the conductors 435 and 441 are applied as inputs to an AND circuit 560, the output from the AND circuit 560 being on the conductor 561 that is connected to a Schmidt trigger circuit 565 of the construction of the Schmidt trigger circuit 330 described above. The conductor 561 also connects to the monostable multivibrator 555, and the conductor 475 also connects to the Schmidt trigger circuit 565. The output from the Schmidt trigger circuit 565 appears on the conductor 566 and is applied to a delay circuit 570 having the construction of the delay circuit 260 described above, the output from the delay circuit 570 being on the conductor 571 connected to a monostable multivibrator 575. The monostable multivibrator 575 is of the same construction as the monostable multivibrator 270 and is connected by a conductor 576 to a combination Schmidt trigger and AND circuit 580, of the construction of the circuit 330, the output of which is connected to a delay circuit 585 of the construction of the delay circuit 260, the output of the delay circuit 585 being on a conductor 586 connected to an output control circuit 590 having the same construction and arrangement as the control circuits 370 described above. The conductor 576 also connects via a conductor 535 as an input to the filter 501, the conductor 541 is also connected as an input to the AND circuit 580 and a HOLD ON circuit is provided interconnecting the conductor 581 and a monostable multivibrator 575.

Referring now to FIG. 7 of the drawings, there are illustrated the further details of the filters 401 and 501 and the inverter 460. As illustrated, the filter 401 includes an inductor in the form of a coil 402 having associated therewith a magnetic core 403, at least a portion of the core 403 being movable and adjustable, whereby the inductor 402 can be slug tuned. The inductor 402 has an input terminal 404 that is connected by a conductor 409 to one terminal of a capacitor 405, and through a capacitor 408 to the conductor 165, the other terminal of the capacitor 405 being grounded as at N, the output from the filter 401 appearing on the conductor 409. The inductor 402 has a plurality of taps thereon, and specifically 10 taps that are identified by the numerals 410 through 419. Associated with selected ones of the taps are two transistors 420 and 430. More specifically, the transistor 420 has a base 421 that is connected to one terminal of a resistor 426 by means of a conductor 404, the other terminal of the resistor 426 being connected to the conductor 425. The transistor 420 has a collector 422 that is connected to the tap 419 on the inductor 402, while the emitter 423 is connected to ground potential.

The transistor 430 has a base 431 that is connected to one terminal of a resistor 436, the other terminal of the resistor 436 being connected to the conductor 435. The transistor 430 has a collector 432 that is connected to the tap 412 on the inductor 402, while the emitter 433 is connected to ground potential.

The tapped filter 501 includes an inductor in the form of a coil 502 having associated therewith a magnetic core 503, at least a portion of the core 503 being movable and adjustable whereby the inductor 502 can be slug tuned. The inductor 502 has an input terminal 504 that is connected by a conductor 509 to one terminal of a capacitor 505 and through a capacitor 508 to the conductor 165, the other terminal of the capacitor 505 being grounded as at N, the output from the filter 501 appearing on the conductor 509. The inductor 502 has a plurality of taps thereon, and specifically, 10 taps that are identified by the numerals 510 through 519. Associated with the selected ones of the taps are two transistors 520 and 530. More specifically, the transistor 520 has a base 521 that is connected by a conductor 524 to one terminal of a resistor 526, the other terminal of the resistor 526 being connected to the conductor 525. The transistor 520 has a collector 522 that is connected to the tap 511 on the inductor 502, while the emitter 523 is connected to ground potential.

The transistor 530 has a base 531 that is connected to one terminal of the resistor 536, the other terminal of the resistor 536 being connected to the conductor 535. The transistor 530 has a collector 532 that is connected to the tap 518 on the inductor 502, while the emitter 533 is connected to ground potential.

Associated with the tone control circuits is the inverter 460 that is also illustrated in detail in FIG. 7, the inverter being in the form of a transistor 470 having a base 471 connected through a resistor 462 to the conductor 435. The transistor 470 further has its emitter 473 grounded and the collector 472 is connected to the conductor 425 and through a resistor 461 to the +DC conductor 155.

Considering now the operation of the receiver 400, in order to obtain an output from the loudspeaker 125, a four tone sequence of the proper selected control tones must be applied to the receiver 400, each tone preferably having a time duration of at least about 40 milliseconds and adjacent tones having substantially no gaps therebetween. Furthermore, the first and third tones received must be those to which the filter 401 is tuned when the transistors 420 and 430, respectively, are conducting, and the second and fourth tones received must be those to which the filter 501 is tuned when the transistors 520 and 530, respectively, are conducting.

Upon the reception of the first tone, an audio signal corresponding to the first tone is applied along the conductors 123–124 as an input to the limiter 150, and there appears on the conductor 165 a series of square wave forms. The transistor 470 in the inverter 460 is off at this time so as to allow the transistor 420 to be conducting and thus to tune the filter 401 for reception of the first control tone. Accordingly, the output on the conductor 165 is developed across the resonance circuit and the output of filter 401 as a sinusoidal wave form appears on the conductor 409. The sinusoidal wave form on the conductor 409 is rectified by the rectifier 440 and is applied as one of the positive inputs to the AND CIRCUIT 445, the other required positive input being applied along the conductor 425.

The output of the AND circuit 445 is a positive voltage which triggers the Schmidt trigger 450, thus to cause a negative going voltage to be applied along the conductor 451 to the delay circuit 452 which after a predetermined time interval cause a trigger pulse to be applied on removal of tone to the monostable multivibrator 455. Upon the removal of the first tone from the receiver 400, a positive output is derived from the multivibrator 455 that is applied along the conductor 525 to select the second tone in the filter 501 by rendering the transistor 520 conductive in the filter 501 and also to provide one of the necessary positive inputs to the AND circuit 545.

Assuming that the second control tone in the sequence is now received, the filter 501 is resonant to the input frequency and thereby develops a sinusoidal wave form at conductor 509 of the second control tone frequency thereon which is applied to the rectifier 540. The output from the rectifier 540 is a positive voltage that provides the second required positive input to the AND circuit 545, thereby to cause an output therefrom that is applied to the Schmidt trigger circuit 550. The output from the AND circuit 545 is fed back along the conductor 546 to the multivibrator 455 to hold it in the active condition for the duration of the second tone, regardless of the time duration of the second tone. The output from the AND circuit 545 also trips the Schmidt trigger circuit 550 and the output is applied to the delay circuit 552, whereby if the output from the Schmidt trigger circuit persists for the predetermined delay period, the multivibrator 555 will provide an output on the interruption of the second control tone. The output of the multivibrator 555 is applied along the conductor 435 to select the proper tone No. 3 in the filter 401 by rendering the transistor 430 conductive, and the output for the multivibrator 555 is also applied along the conductor 435 as a positive input to the AND circuit 560 and to the inverter 460. The inverter 460 now conducts so as to cause the transistor 420 to cease conduction and thus effectively to remove the connection thereof in the filter 401, and at the same time positive voltage is removed from the conductor 425 to the AND circuit 445 preventing it from operating.

If the proper third control tone is now received on the conductor 165, the filter 401 will pass the third control tone to the rectifier 440 which will now apply the third control tone as a positive input to the AND circuit 445 (there being no output from circuit 445 since there is now no input on conductor 425) and also to provide a second input to the AND circuit 560, whereby a potential is applied along the conductor 561 to the multivibrator 555 to hold it in the active conduction so long as the third tone is received.

Output of the AND circuit 560 is also applied to the Schmidt trigger circuit 565, the output of which is supplied along the conductor 566 through the delay circuit 570 and the conductor 571 to the multivibrator 575. Provided that the third tone persists for a time interval, determined by the delay circuit 570, upon the release or removal of the third tone, the multivibrator 575 causes an output pulse to appear on the output conductor 576 which is fed back to select the proper filter for tone No. 4 along the conductor 535, and this signal is also applied as one of the positive inputs to the AND circuit 580.

Assuming that the proper fourth tone in the sequence of tones is now received, there will be an output from the filter 501 and the rectifier 540 which is applied along the conductor 541 as a second positive input to the AND circuit 580, thereby to provide an output therefrom that is fed via the conductor 581, the delay circuit 585 and the conductor 586 to the output control circuits 590, whereby the circuits 590 are energized if the time duration of the fourth tone is longer than the delay provided by the delay circuit 585. It is noted that a HOLD ON potential is applied from the output of the AND circuit of the conductor 580 along the conductor 581 to the multivibrator 575 to hold it in the active condition so long as the fourth tone is received. The output signal on the conductor 586 is operative to cause operation of the circuits 590 in the same manner as the control circuits 370 described above, thereby to energize the relay 130 and to connect the loudspeaker 125 to the output of the transformer 120.

It is further pointed out that in the receiver 100 of FIG. 2 a fixed bias has been applied to the first Schmidt trigger circuit, which circuit is so designed that a full output is obtained therefrom whenever the fixed voltage bias is exceeded. If the fixed voltage bias is not exceeded, the circuit is completely inoperative. The limiter 150 provides a square wave as an input to the filters, which square wave is of constant amplitude, whereby there is a constant output voltage from the filters for any given tone frequency. These features provide a constant frequency bandwidth for the limited signal, i.e., the upper and lower frequency that will trip the Schmidt trigger circuit is predetermined by the interrelationship between the filter curve, the limiting level, and the DC bias level. As explained above, the limiting or bias level can be varied to alter the response bandwidth. On all other Schmidt triggers the bias is supplied by the monostable multivibrator feeding its AND input when it is triggered to the "on" condition. These are each shown with a potentiometer similar to 295 in FIG. 4.

Referring now to FIGS. 8 and 9 of the drawings, there is illustrated a third embodiment of the present invention wherein a sequence of 7 tones is required to actuate the receiver, the receiver being designated by the numeral 600 and being illustrated in schematic and block diagram form in FIG. 8. The receiver 600 utilizes the input circuits and components from the antenna 101 through the limiter 150 and onto the conductor 165 from the receiver 100, whereby the same reference numerals have been applied to these components and the description thereof will not be here repeated in the interest of brevity.

The output of the limiter 150 on the conductor 165 is fed to two-tone control circuits, the lower tone control circuit including a special tapped filter 601 identified by the legend FILTER # 1 of a construction to be described hereinafter, the input to the filter 601 being a series of square waves and the output thereof appearing on a conductor 609 in the form of a sinusoidal wave having the frequency of the selected control tone. The conductor 609 connects to a rectifier 670 which serves to rectify the input thereto and which has the same construction as the rectifier 220 above. The output from the rectifier 670 is a positive voltage that is supplied along a conductor 671 as one of the inputs to an AND circuit 672. The output from the AND circuit 672 appears on a conductor 673 that is connected to the input of a Schmidt trigger circuit 675, the AND circuit 672 and the Schmidt trigger circuit 675 together having the construction of the Schmidt trigger circuit 330 described above. The output from the Schmidt trigger circuit 675 is connected by a conductor 676 to a delay circuit 680 of the same construction as the delay circuit 260, and the output from the delay circuit 680 is connected by a conductor 681 as one input to a monostable multivibrator 685 of the construction described above with respect to the monostable multivibrator 270. The output from the multivibrator 675 appears on a conductor 725 that connects into the upper tone control channel.

The upper tone control channel includes a special tapped filter 701 identified as FILTER # 2, also to be described more fully hereinafter, one of the inputs to the filter being from the conductor 165 and other inputs being from the conductors 725, 735 and 745, to be described more fully hereinafter. The output from the filter 701 appears on the conductor 709 connected to a rectifier 770 of the same construction as the rectifier 320 described above. The output from the rectifier 770 is on a conductor 771 that supplies one input to an AND circuit 772, the output of which appears on a conductor 773 connected as an input to a Schmidt trigger circuit 775; the AND circuit 772 and the Schmidt trigger circuit 775 together having the construction of the Schmidt trigger circuit 330 described above. The output from the Schmidt trigger circuit 775 appears on a conductor 776 and is supplied as an input to a delay circuit 780 having the construction of the delay circuit 260 described above. The output from the delay circuit 780 appears on a conductor 781 and is an input to a monostable multivibrator 775 having a construction like the monostable vibrator 270.

The output from the monostable multivibrator 785 appears on a conductor 635 and is applied as an input to the filter 601 and as an input to a NOR circuit 800. Other inputs to the NOR circuit 800 are applied by the conductors 645 and 655, while the output from the NOR circuit 800 appears on the conductor 625.

The outputs on the conductors 635 and 671 are applied as inputs to the first of four tone selecting and responding circuit 870, each of which includes an AND circuit 872, a Schmidt trigger circuit 875, a delay circuit 880 and a monostable multivibrator 885, the AND circuit 872 in combination with the Schmidt trigger circuit 875 having the construction of the Schmidt trigger 330, the delay circuit 880 having the construction of the delay circuit 260 and the monostable multivibrator 885 having the construction of the multivibrator 270, all described heretofore.

More specifically, the inputs on the conductors 635 and 671 are applied as inputs to such a tone selecting and responding circuit 870A including an AND circuit 872A. The output from the AND circuit 872A appears on a conductor 873A which is connected to the input of a Schmidt trigger circuit 875A, and also as an input to the monostable multivibrator 785. The output from the Schmidt trigger circuit 875A is connected by a conductor 876A to a delay circuit 880A, the output of which is applied along a conductor 881A as an input to a monostable multivibrator 885A. The output of the monostable multivibrator 885A, which is also the output of the tone selecting and responding circuit 870A, is applied along the conductor 735 as a tone-selecting signal to the filter 701 and as an input to the next tone selecting and responding circuit 870B.

The tone selecting and responding circuit 870B has the same essential construction and arrangement as the tone selecting and responding circuit 870A, and therefore in the interest of brevity will not be repeated, it being pointed out that one of the outputs therefrom appears on a conductor 873B which is a HOLD ON circuit for the multivibrator 885A, and the output from the circuit 870B appears on the conductor 645 and is applied as a tone-selecting signal to the filter 601 and as the input to the next tone selecting and responding circuit 870C.

The tone selecting and responding circuit 870C likewise has the same essential construction and arrangement as the circuit 870A, and therefore will not be described in detail, except to point out that one of the outputs therefrom is along the conductor 837C to the multivibrator 885B serves as a HOLD ON signal therefor, and the output from the circuit 870C appears on the conductor 745 and is applied as the signal to the filter 701 to select control tone No. 6.

The output from the circuit 870C is applied also as an input to the circuit 870D which has the same essential construction and arrangement as the circuit 870A, it merely being pointed out that one of the outputs thereof is a HOLD ON signal appearing on the conductor 873D which is applied to the multivibrator 885C, the output of the circuit 870D appearing on the conductor 655 and being applied as a signal to the filter 601 to select the control tone No. 7.

The output of the circuit 870D is also applied as one of the inputs to a combination Schmidt trigger and AND circuit 980 of the construction of the circuit 330 described above, the signal on the conductor 671 also being applied thereto. The output from the circuit 980 is applied along a conductor 981 to a delay circuit 985 of the same construction as the delay circuit 260, the output of the circuit 980 also being applied to the multivibrator 885D as a HOLD ON signal therefor. The output of the delay circuit 985 is applied along a conductor 986 to an output control circuit 990 having a same construction and arrangement as the control circuits 370 described above.

Referring now to FIG. 9 of the drawings, there are illustrated the further details of the filter 601 and 701 and of the NOR circuit 800. As illustrated, the filter 601 includes an inductor in the form of a coil 602 having associated therewith a magnetic core 603, at least a portion of the core 603 being movable and adjustable, whereby the inductor 602 can be slug tuned. The inductor 602 has an input terminal 604 that is connected by a conductor 609 to an output terminal 607 and through a capacitor 608 to the conductor 165, the other terminal of the capacitor 605 being grounded as at N, the output from the filter 601 appearing on the conductor 609. The inductor 602 has a plurality of taps thereon, and specifically 10 taps that are identified by the numerals 610 through 619, each of the taps as illustrated being connected by a suitable conductor to a male terminous in a plug 660. Associated with selected ones of the taps are four transistors 620, 630, 640 and 650. More specifically, the transistor 620 has a base 621 that is connected to one terminal of the resistor 626 by means of a conductor 624, the other terminal of the resistor 626 being connected to the conductor 625. The transistor 620 has a collector 622 which is connected by a conductor 627 to a male terminous in a connector 669. The emitter 623 is connected to ground potential.

The transistors 630, 640 and 650 each have the same construction and arrangement as the transistor 620 whereby the various parts thereof and the circuit elements connected thereto have had applied thereto like reference numerals in the corresponding series of numerals. In order to connect the several collectors to selected ones of the taps on the inductor 602, a connector 605 has been provided having selected connections 666, 667 and 668 which selectively interconnect certain of the male termini on the connector 660 to selected male termini on the connector 669. As illustrated, the conductor 666 connects the collector 632 to the tap 610; the conductor 667 connects the connector 662 to the tap 616; and the conductor 668 connects both the collector 622 and the collector 652 to the same tap 616.

The tapped filter 701 includes an inductor in the form of a coil 702 having associated therewith a magnetic core 703, at least a portion of the core 703 being movable and adjustable, whereby the conductor 702 can be slug tuned. The conductor 702 has an input terminal 704 that is connected by a conductor 709 to one terminal of a capacitor 705 and through a capacitor 708 to the conductor 165, the other terminal of the capacitor 705 being grounded as at N, the output from the filter 701 appearing on the conductor 709. The inductor 702 has a plurality of taps thereon, and specifically 10 taps that are identified by the numerals 710 through 719, each of the taps being connected to a male terminous in a connector 750. Associated with selected ones of the taps are three transistors 720, 730 and 740. The transistor 720 has a base 721 that is connected by a conductor 724 to one terminal of a resistor 726, the other terminal of the resistor 726 being connected to the conductor 725. The transistor 720 has a collector 722 that is connected by a conductor 727 to a male terminous in a connector 759 and has an emitter 723 connected to ground potential.

The transistors 730 and 740 have the same construction and essentially the same circuit connections as the transistor 720, and accordingly, in the interest of brevity, like reference numerals have been applied to like parts thereof in the appropriate number series. It is pointed out that each of the collectors terminates in a male terminous in the connector 759. In order to connect the several collectors to the required tap on the inductor 702, a connector 755 has been provided having conductors 756, 757 and 758 therein arranged to connect selected ones of the male termini in the connector 750 and 759. More specifically, the conductor 756 connects the collector 732 to the tap 711; the conductor 757 connects the collector 740 to the tap 715; and the conductor 758 connects the collector 722 to the tap 719.

From the above, it will be seen that by suitable selection of connections within the conductors 665 and 755, any one of the taps on the inductors 602 and 702, respectively, can be connected to any one of the tone-selecting transistors associated in the respective filters 601 or 701. In other words, selection of the desired tap is made by a simple wire connection, whereby the selection of the desired tone frequency in a tone sequence is effected entirely by the conductors or jumper wires 666, 667, etc. which connect the two connectors 660–669 and 750–759, respectively. Thus the provision of two tapped coils and the connectors suitably wired as explained above will permit the selection of any one of 20 million tone combinations in a seven-digit tone control circuit of the type illustrated by the receiver 600. It will be appreciated that the connection arrangement may be provided in the tapped filters in the receivers 100 and 400, thereby to permit like simple selection of the desired code by means of replacing only the connector such as the connectors 665 and 755 described above.

Associated with the tone control circuits, and useful in selecting the proper tone to be passed by the filters 601 and 701, is the NOR circuit 800, the NOR circuit as illustrated including three transistors 810, 820 and 830. The transistor 810 has a base 811 that is connected by a conductor 814 to one terminal of a resistor 815, the other terminal of the resistor 815 being connected to the conductor 635 which is the third tone selector conductor. The transistor 810 also has a collector 812 connected to the conductor 625 which is the first tone selector conductor, and has an emitter 813 that is grounded as at N. The transistor 820 has a base 821 connected by a conductor 824 to one terminal of the resistor 825, the other terminal of the resistor 825 being connected to the resistor 815 which is the fifth tone selector conductor. The transistor 820 also has a collector 822 connected to the conductor 625 and an emitter 823 connected to ground potential. The transistor 830 has a base 831 connected by a conductor 834 to one terminal of a resistor 835, the other terminal of the resistor 835 being connected to the resistor 655 which is the seventh tone selector conductor. The transistor 830 also has a collector 822 connected to the conductor 625 and an emitter 833 connected to ground potential. It also is pointed out that the conductor 625 is connected by a resistor 836 to the +12-volt DC conductor 155.

Considering now the operation of the receiver 600, in order to obtain an output from the loud speaker 125, a seven-tone sequence of the proper selected control tones must be applied to the receiver 600, each tone preferably having a time duration of at least about 25 milliseconds and adjacent tones having substantially no gaps therebetween. Furthermore, the first and third and fifth and seventh tones received must be those to which the filter 601 is tuned when the transistors 620, 630, 640 and 650, respectively, are conducting; and the second and fourth and sixth tones received must be those to which the filter 701 is tuned when the transistors 720, 730 and 740, respectively, are conducting. Upon the reception of the first tone, an audio signal corresponding to the first tone is applied along the conductors 123–124 as an input to the limiter 150, and there appears on the conductor 165 a series of square wave forms. The transistors in the NOR circuit 800 are all nonconducting, whereby a high potential is applied from the conductor 155 via the resistor 836 and the conductor 625 to the base 621 of the transistor 620 to the base 621 of the transistor 620. As a result, the transistor 620 is conducting thereby to connect the associated tap 619 as the effective tap on the inductor 602 in the filter 601. Assuming that the first control tone is of the proper frequency as selected by the transistor 620, an output is developed on the conductor 609 [, an output is developed on the conductor 609 ] in a form of sinusoidal wave of the frequency of the first control tone. The sinusoidal wave on the conductor 609 is rectified by the rectifier 670 and is applied as one of the positive inputs to the AND circuit 672, the other required positive input being applied from the conductor 625 as explained above.

The output of the AND circuit 672 is a positive voltage which triggers the Schmidt trigger circuit 675, thus to cause a negative going voltage to be applied along the conductors 676 to the delay circuit 680, which after a predetermined time interval is in condition such that the cessation of the first control tone causes a trigger pulse to be applied to the monostable multivibrator 685. Upon the removal or cessation of the first tone, positive output is thus derived from the multivibrator 685 that is applied along the conductor 725 to select the second tone in the filter 701 by rendering the transistor 720 conductive, and also to provide one of the necessary positive inputs to the AND circuit 772.

Assuming that the second control tone in the sequence is now received and the filter 701 is resonant thereat, there is developed a sinusoidal wave form on the conductor 709 having a frequency corresponding to that of the second control tone, which ouput is then applied to the rectifier 770. The output from the rectifier 770 is a positive voltage that is applied along the conductor 771 as the second required input to the AND circuit 772, thereby to provide an output from the AND circuit 772. The output of the AND circuit 772 is applied along the conductor 773 to the multivibrator 685 to hold it in the active condition for the duration of the second tone, regardless of the time duration of the second tone, and the output is also applied to the Schmidt trigger circuit 775 to cause an output therefrom to appear on the conductor 776 that is applied to the delay circuit 780. Assuming that the second control tone persists for a time that exceeds the delay time of the circuit 780, then upon cessation of the second control tone, the multivibrator 785 is triggered to provide an output on the conductor 635. The positive going output on the conductor 635 is applied to the base of the transistor 630 in the filter 601, thus to select the filtering frequency for the third control tone, and the output is also applied as one of the two required inputs to the AND circuit 872A in the tone selecting and responding circuit 870A. Furthermore, the output from the multivibrator 785 is applied to the NOR circuit 800, and specifically to the base of the transistor 810 therein, thus to cause the heavy conduction thereof and to drop the potential on the conductor 625, thereby effectively to remove the transistor 620 by causing the transistor to become nonconductive, thus leaving only the transistor 630 and that portion of the inductor 602 associated therewith as active elements in the filter 601.

The circuit is now in condition for the reception of the third control tone, which if applied at this time and at the proper frequency causes a sinusoidal output of a corresponding frequency on the conductor 609. The sinusoidal wave for the third tone on the conductor 609 is supplied to the rectifier 670 where it is rectified to provide a positive going voltage on the conductor 671. Although the positive going voltage on the conductor 671 is applied to the AND circuit 672, there is no output from the AND circuit 672 at this time because the second required positive potential thereto has been removed from the conductor 625 by the operation of the NOR circuit as described above. The positive going voltage on the conductor 671 is however applied as an input to the AND circuit 872A, thus to provide a second positive input thereto which causes an output therefrom to appear on the conductor 873A. The output on the conductor 873A is applied to the multivibrator 785 as a HOLD ON potential to hold the multivibrator 785 active so long as the third control tone persists. The output on the conductor 873A is also applied to the Schmidt trigger 875A which applies the output therefrom to the delay circuit 880A. Assuming that the third control tone persists for a time interval greater than the time duration of the delay from 880A, then upon cessation of the third control tone, the multivibrator 885A is tripped to provide an output on the conductor 735A. The output on the conductor 735A is a positive going voltage that is applied as an input to the filter 701, and specifically to the base of the transistor 730 to ready the filter 701 for reception of the fourth control tone. It is further noted that the multivibrator 685 at this time has assumed its normal condition, whereby to remove the positive potential from the base of the transistor 720, thus to remove this connection to the inductor 702, thus leaving the selection by the transistor 730 as the only connection to the inductor 702.

The circuit is now in condition for reception of the fourth control tone which is applied from the limiter 150 as a square wave on the conductor 165 to the filter 701. Assuming that the fourth tone is of the frequency selected by rendering the transistor 730 conducting, an output will be obtained on the conductor 709 that will be a sinusoidal wave having the frequency of the fourth control tone. This sinusoidal wave will be applied along the conductor 709 to the rectifier 770 and the output therefrom will be a positive going voltage applied to the conductor 771. Although this positive going voltage is applied to the AND circuit 772, there will be no output therefrom since the second required output from the multivibrator 685 is now missing. The positive going voltage on the conductor 771 will be applied as a second input to the AND circuit 872B, the first positive input being from the multivibrator 885A as described above. There now is an output from the AND circuit 872B which appears on the conductor 873B, this output being applied back to the multivibrator 885A as a HOLD ON potential therefor in order to render this circuit active so long as the fourth tone is being received. The conduction from the AND circuit 872B also is applied to the Schmidt trigger circuit 875B, the output of which is applied to the delay circuit 880B. If the fourth tone persists for a time duration that exceeds the delay time of the circuit 880B, then upon the cessation of the fourth tone, the multivibrator 885B is tripped to provide a positive going output therefrom on the conductor 645. The output on the conductor 645 is applied to the filter 601, and specifically to the base of the transistor 640 to select tone No. 5, and is applied to the NOR circuit 800, and specifically to the base of the transistor 820 to cause conduction thereof so as to be sure that the transistor 620 is nonconducting, the transistor 630 being rendered nonconducting by the return of the multivibrator 785 to the normal condition thereof, whereby the only active connection in the filter 602 is that provided by the transistor 640 which selects the frequency of the fifth control tone. The output on the conductor 645 is also applied as one of the positive inputs to the circuit 872C forming a part of the tone selecting and responding circuit 870C.

Assuming that the fifth control tone of proper frequency is now received, it will be applied along the conductor 165 to the filter 601 that will provide an output on the conductor 609 in the form of a sinusoidal wave having a frequency of the fifth control tone. This output is rectified by the rectifier 670 to provide a positive voltage on the conductor 671, the AND circuits 672 and 872A not responding at this time since neither has the second positive voltage applied thereto. The positive going output is also applied as the second required input to the AND circuit 872C so as to provide an output therefrom on the conductor 873C. This output is applied to the multivibrator 885B to hold it in the active condition so long as the fifth tone is received, and is also applied as the input to the Schmidt trigger circuit 875C, which circuit operates to provide an input to the delay circuit 880C. Assuming that the fifth tone persists for a time duration greater than the time delay of the circuit 880C, then upon cessation of the fifth control tone, the multivibrator 885C operates to provide a positive going voltage on the output conductor 745. The positive going voltage on the conductor 745 is applied to the filter 701, and specifically, to the base of the transistor 740 to render the transistor 740 conductive, and thus to select the frequency for the sixth control tone. It is noted at this time that the multivibrator 885A has returned to its normal condition whereby to remove the potential from the conductor 735 so as to render the transistor 730 nonconducting. The output on the conductor 745 is also applied as one of the positive inputs to the AND circuit 872D forming a part of the tone selecting and responding circuit 870D.

Assuming that the sixth control tone of the proper frequency is now received, an output is applied along the conductor 165 to the filter 701 and there is derived therefrom a sine wave on the conductor 709 having a frequency corresponding to that of the sixth control tone. This sine wave is rectified by the rectifier 770 and applied to the conductor 771, the only AND circuit now in condition to act therefrom being the AND circuit 872D that now provides an output on the conductor 873D that is applied to the Schmidt trigger circuit 875D, the output from the Schmidt trigger circuit 875D being applied to the delay circuit 880D. It also is pointed out that the output on the conductor 873D is applied as a HOLD ON potential to the multivibrator 885C so that it is held in the active condition so long as the sixth control tone is received. Assuming that the sixth control tone persists for a time duration that exceeds the time delay of the circuit 880D, upon cessation of the sixth control tone the multivibrator 885D operates to provide a positive voltage on the conductor 655. The positive voltage on the conductor 655 is applied to the filter 601, specifically to the base of the transistor 650 to render it conducting, and is also applied to the NOR circuit 800 to ensure that the transistor 620 is rendered nonconducting by causing the transistor 830 to conduct. As a consequence, the only active connection in the filter 601 is that provided by the conducting transistor 650. The positive going signal on the conductor 655 is also applied as one of the positive required inputs to the combined Schmidt trigger and the AND circuit 980.

Assuming that the seventh control tone of the proper frequency is now received, an output is provided on the conductor 165 that is applied to the filter 601. Since the transistor 650 is now conducting to select the proper seventh control tone frequency, a sine wave output is obtained on the conductor 609 having a frequency corresponding to that of the seventh control tone. This output is rectified by the rectifier 670 to provide a positive voltage on the conductor 671. The only AND circuit now in condition to be activated by the application of the positive voltage from the conductor 671 is that in the combination Schmidt trigger and AND circuit 690 which is now operated to provide an output therefrom on the conductor 981. The output on the conductor 981 is applied as the HOLD ON potential for the multivibrator 885D, thereby to hold this circuit in the active condition so long as the seventh tone persists. The output on the conductor 981 is also applied to the delay circuit 985. If the seventh tone persists for a time interval that exceeds the time delay of the circuit 985, the delay circuit 985 operates to provide an output signal on the conductor 986 which will cause operation of the output control circuit 990. The output signal on the conductor 986 is operative to cause operation of the circuit 990 in the same manner as the control circuit 370 described above, thereby to energize the relay 130 and to connect the loud speaker 125 to the output of the transformer 120.

From the above, it will be seen that there has been provided an improved selective calling communication system and improved components therefor which will fulfill all of the objects and advantages set forth above.

Although there have been illustrated and described certain preferred embodiments of the invention, it is to be understood that various changes and modifications can be made therein without departing from the spirit and scope of the invention, and it is intended that all such changes and modifications be covered as fall within the scope of the appended claims.

What I claim is:

[ 1. A communication system comprising a transmitter including a tone-generating circuit for generating tones selected from a first group of tones in a first band of frequencies and for generating tones selected from a second group of tones in a second band of frequencies separate and distinct from said first band of frequencies, said first band of frequencies being separated from second band of frequencies by a substantial intermediate band of frequencies, said tone-generating circuit generating a sequence of tones alternately selected from said first and second groups of tones, the time duration of the gap between adjacent tones being substantially zero, a transmitter output circuit coupled to said tone-generating circuit for transmitting signals corresponding to the sequence of tones a receiver including an input circuit for receiving the signals from said transmitter, a first tone control circuit, a second tone control circuit, said first tone control circuit being coupled to said input circuit and to said second tone control circuit and responsive to the application of tones from said first group of tones to said input circuit to provide first control signals to said second tone control circuit, said second tone control circuit being coupled to said input circuit and to said first tone control circuit and responsive to the application of the tones from said second group of tones to said input circuit to provide second control signals to said first tone control circuit, one of said tone control circuits furnishing an output control signal in response to the application of the last tone in the sequence of tones, and an output signal utilization circuit coupled to said one tone control circuit for utilizing said output control signal therefrom.]

[2. The communication system, set forth in claim 1, wherein certain of the tones in said second band of frequencies are harmonics of certain tones in said first band of frequencies.]

[3. The communication system set forth in claim 1, wherein said first band of frequencies and said second band of frequencies are in the audio range of frequencies.]

[4. The communication system set forth in claim 1, wherein each of said band of frequencies contains at least ten separate tones with each tone being separated from adjacent tones by about 3⅓ percent of the frequency thereof.]

[5. The communication system set forth in claim 1, wherein the frequency of a tone is slightly greater than 1.035 times the frequency of the next lower tone.]

[6. The communication system set forth in claim 1, wherein said transmitter includes a generator for generating a carrier signal that is modulated by the control tones.]

[7. The communication system set forth in claim 6, wherein the control tones are applied to the carrier signal by frequency modulation.]

[8. The communication system set forth in claim 1, wherein said sequence of tones comprises one tone selected from said first groupo of tones and having a time duration not substantially greater than 40 milliseconds and one tone selected from said second group of tones and having a time duration of at least not substantially greater than 40 milliseconds.]

[9. The communication system set forth in claim 1, wherein said sequence of tones comprises two tones selected from said first group of tones having a time duration not substantially greater than 40 milliseconds and two tones selected from said second group of tones each having a time duration of not substantially greater than 40 milliseconds.]

[10. The communication system set forth in claim 1, wherein said sequence of tones comprises four tones selected from said first group of tones and each having a time duration not substantially greater than 40 milliseconds and three tones selected from said second group of tones each having a time duration of not substantially greater than 40 milliseconds.]

11. In a communication system for selectively transmitting signals including a sequence of control tones alternately selected from a first group of tones in a first band of frequencies and from a second group of tones in a second band of frequencies separate and distinct from said first band of frequencies, a receiver comprising an input circuit for receiving the signals from an associated transmitter, a first tone control circuit, a second tone control circuit, means coupling said first tone control circuit to said input circuit and to said second tone control circuit, said first tone control circuit having a first tapped filter therein adjustable to a selected one of a plurality of positions respectively corresponding to a selected tone in said first group of tones so that upon the application of the selected tone to said input circuit there is produced first control signals that are applied to said second tone control circuit means coupling said second tone control circuit to said input circuit and to said first tone control circuit, said second tone control circuit having a second tapped filter therein adjustable to a selected one of a plurality of positions respectively corresponding to a selected tone in said second group of tones so that upon the application of the selected tone to said input circuit there is produced second control signals that are applied to said first tone control circuit, one of said tone control circuits furnishing an output control signal in response to the application of the last tone in the sequence of tones, an output signal utilization circuit coupled to said one tone control circuit for utilizing said output control signal therefrom.

12. The receiver set forth in claim 11, wherein said first tapped filter is adjustable to pass a selected tone in a first band of frequencies and said second tapped filter is adjustable to pass a selected tone in a second band of frequencies, said first band of frequencies being separated from said second band of frequencies by a substantial intermediate band of frequencies.

13. The receiver set forth in claim 11, wherein said first and second tapped filters are adjustable to pass tones that are in an audio range of frequencies.

14. The receiver set forth in claim 11, wherein each of said tapped filters is adjustable to pass a selected one of at least ten separate tones, each tone being separated from the adjacent tones by about 3⅓ percent of the frequency thereof.

15. The receiver set forth in claim 11, and further comprising a holding circuit interconnecting said first and second tone control circuits so as to accommodate tone duration of any length longer than a delay period provided the time gap between adjacent tones in the sequence of tones is substantially zero.

16. The receiver set forth in claim 11, wherein said first tapped filter has a connection to only one of the taps thereon and said second tapped filter has a connection to only a signal tap thereon, whereby said receiver is responsive to a sequence of two selected tones.

17. The receiver set forth in claim 11, wherein said first tapped filter has connections to two of the taps thereon corresponding to two tones in said first group of tones, and said second tapped filter has connections to two gaps thereon corresponding to two tones selected from said second group of tones, whereby said receiver is responsive to a sequence of four control tones.

18. The receiver set forth in claim 11, wherein said first tapped filter has connections to four of the taps thereon corresponding to four tones selected from said first group of tones, and said second tapped filter has connections to three taps thereon corresponding to three tones selected from said second group of tones, whereby said receiver is responsive to a sequence of seven selected tones.

19. The receiver set forth in claim 11, wherein the selection of connections to the taps on said tapped filters is made mechanically.

20. The receiver set forth in claim 11, wherein the connection to the selected tap on said tapped filter is made electronically.

21. The receiver set forth in claim 11, wherein the selection of the tones to which the receiver is responsive is made by the connectors which connect said tapped filters to the tone receiver components.

22. A communication receiver for responding to a sequence of first and second control tones, said receiver comprising an input circuit for receiving the control tones, a first filter coupled to said input circuit and tuned to the frequency of the first control tone and providing a signal which has an amplitude dependent upon the frequency of the control tone applied thereto, a first electronic switching device coupled to said first filter and responsive to a signal from said first filter exceeding the threshold of said first switching device to provide a DC voltage of fixed value independent of the amount by which the amplitude of the signal from said first filter exceeds said threshold level, a first delay circuit coupled to said first electronic switching device and operative to produce at its output a first control signal only when the first control tone has persisted for a predetermined fixed duration, a second filter coupled to said input circuit and tuned to the frequency of the second control tone and providing a signal which has an amplitude dependent upon the frequency of the control tone applied thereto, a second electronic switching device coupled to said first delay circuit and to said second filter and responsive to both said first control signal and to a signal exceeding the threshold level of said second switching device to provide a DC voltage of fixed value and independent of the amount by which the amplitude of the signal from said second filter exceeds said threshold level, a second delay circuit coupled to said second electronic switching device and operative to produce at its output a second control signal only when the second control tone has persisted for a predetermined fixed duration, and a control signal utilization circuit coupled to said second delay circuit for utilizing said second control signal.

23. The communication receiver set forth in claim 22, wherein each of said electronic switching devices is a transistor means having its base coupled to the associated filter and having its collector and emitter coupled to the associated delay circuit.

24. The communication receiver set forth in claim 22, wherein each of said delay circuits includes a capacitor and resistor coupled in series across the output of the associated electronic switching device, and the output of each delay circuit is the junction of the resistor and capacitor.

25. A tone control circuit for use in a communication receiver including an input circuit which provides a sequence of control tones and including an output signal utilization circuit, said tone control circuit comprising filter means coupled to the input circuit and having a plurality of control inputs for receiving one at a time signals selectively to tune said filter means to predetermined frequencies, a plurality of AND circuits corresponding in number to the number of control tones in the sequence of control tones and each having first and second inputs and an output, control means for providing at the output thereof a control signal during reception of the first control tone in the sequence of control tones, the output of said control means being coupled to one of the control inputs of said filter means and to the first input of the first of said AND circuits, said filter means being responsive to the application of the control signal from said control means to be turned to the frequency of said first control tone, means coupling the output of said filter means to the second input of each of said AND circuits, said first AND circuit being responsive to the application thereto of both the control signal from said control means and said first control tone for producing at the output thereof an output signal, the output of said first AND circuit and the output of each succeeding AND circuit being coupled respectively to the first input of the next succeeding AND circuit, means coupling the outputs of said AND circuits respectively to the control inputs of said filter means, means coupled to said control means for removing the control signal therefrom after termination of said first control tone, said second AND circuit and each succeeding AND circuit being responsive to the application thereto of both the output signal from the next preceding AND circuit and the associated control tone in the sequence of control tones from said filter means for producing at the output thereof an output signal, said filter means sequentially being tuned to the frequencies of the control tones as they are received by the input circuit in accordance with the sequential application of said output signals to said control inputs, and means coupling the output of the last of said AND circuits to the output signal utilization circuit of the receiver.

26. The tone control circuit set forth in claim 25, and further comprising a plurality of delay circuits corresponding in number to the number of control tones in the sequence of control tones and coupled respectively between said AND circuits, the last of said delay circuits being coupled between the last of said AND circuits and said output signal utilization circuit, each of said delay circuits being operative to produce an output signal only when the associated control tone has persisted for a predetermined duration.

27. A tone control circuit for use in a communication receiver including an input circuit which provides a sequence of control tones and including an output signal utilization circuit, said tone control circuit comprising first filter means coupled to the input circuit and having a plurality of control inputs for receiving one at a time signals selectively to tune said first filter means to predetermined frequencies, second filter means coupled to the input circuit and having a plurality of control inputs for receiving one at a time signals selectively to tune said second filter means to predetermined frequencies, a plurality of AND circuits corresponding in number to the number of control tones in the sequence of control tones and each having first and second inputs and an output, control means for providing at the output thereof a control signal during reception of the first control tone in the sequence of control tones, the output of said control means being coupled to one of the control inputs of said first filter means and to the first input of the first of said AND circuits, said first filter means being responsive to the application of the control signal from said control means to be tuned to the frequency of said first control tone, means coupling the output of said first filter means to the second input of said first AND circuit and to the second input of each succeeding odd-numbered AND circuit, means coupling the output of said second filter means to the second input of said second AND circuit and to the second input of each succeeding even-numbered AND circuit, said first AND circuit being responsive to the application thereto of both the control signal from said control means and said first control tone for producing at the output thereof an output signal, the output of said first AND circuit and the output of each succeeding AND circuit being coupled respectively to the first input of the next succeeding AND circuit, means coupling the outputs respectively of said first AND circuit and of each succeeding odd-numbered AND circuit respectively to the control inputs of said second filter means, means coupling the outputs respectively of said second AND circuit and of each succeeding even-numbered AND circuit respectively to the control inputs of said first filter means, means coupled to said control means for removing the control signal therefrom after termination of said first control tone, said second AND circuit and each succeeding AND circuit being responsive to the application thereto of both the output signal from the next preceding AND circuit and the associated control tone in the sequence of control tones from the associated filter means for producing at the output thereof an output signal, said first and second filter means alternately being tuned to the frequencies of the control tones as they are received by said input circuit by the sequential application to said control inputs of said output signals, and means coupling the output of the last of said AND circuits to the output signal utilization circuit of the receiver.

28. The tone control circuit set forth in 27 and further comprising a first rectifier circuit coupled between said first filter means and the second input of each odd-numbered AND circuit, and a second rectifier circuit coupled between said second filter means and the second input of each even-numbered AND circuit.

29. The tone control circuit set forth in claim 27, wherein the output of said third AND circuit and the output of each succeeding odd-numbered AND circuit is coupled to said control means for removing the control signal therefrom at least during the presence of said third control tone and during the presence of each succeeding odd-numbered control tone.

30. A tone control circuit for use in a communication receiver including an input circuit which provides a sequence of control tones and including a DC voltage utilization circuit, said tone control circuit comprising filter means coupled to the input circuit and having a plurality of control inputs for receiving one at a time signals selectively to tune said filter means to predetermined frequencies, a plurality of AND circuits corresponding in number to the number of control tones in the sequence of control tones and each having first and second inputs and an output, control means for providing at the output thereof a control signal during reception of the first control tone in the sequence of control tones, the output of said control means being coupled to one of the control inputs of said filter means and to the first input of the first of said AND circuits, said filter means being responsive to the application of the control signal from said control means to be tuned to the frequency of said first control tone, means coupling the output of said filter means to the second input of each of said AND circuit, said first AND circuit being responsive to the application thereto of both the control signal from said control means and said first control tone for producing at the output thereof an output signal, a plurality of electronic switching circuits corresponding in number to the number of control tones in the sequence of control tones and each having an input and output, the output of said first AND circuit being coupled to the input of the first of said electronic switching circuits and the output of each succeeding one of said AND circuits being respectively coupled to the input of the next succeeding one of said electronic switching circuits, the output of said first electronic switching circuit being coupled to the first input of [ said first AND circuit ] *the second one of said AND circuits* and the output of each succeeding one of said electronic switching circuits being coupled respectively to the first input of the next succeeding one of said AND circuits means coupling the outputs of said electronic switching circuits respectively to the control inputs of said filter means, said first electronic switching circuit being responsive to the application thereto of the output signal from said first AND circuit for producing at the output thereof a DC voltage, means coupled to said control means for removing the control signal therefrom after termination of said first control tone, said second AND circuit and each succeeding AND circuit being responsive to the application thereto of both the DC voltage from the next preceding electronic switching circuit and the associated control tone in the sequence of control tones from said filter means for producing at the output thereof an output signal, said second electronic switching circuit and each succeeding electronics switching circuit being responsive to the application thereto of the output signal from the next preceding AND circuit for producing at the output thereof a DC voltage, said filter means sequentially being tuned to the frequencies of the control tones as they are received by the input circuit in accordance with the sequential application of said DC voltages to said control inputs, and means coupling the output of the last of said electronic switching circuits to the DC voltage utilization circuit of the receiver.

31. A tone control circuit for use in a communication receiver including an input circuit which provides a sequence of control tones and including a DC voltage utilization circuit, said tone control circuit comprising filter means coupled to the input circuit and having a plurality of control inputs for receiving one at a time signals selectively to tune said filter means respectively to predetermined frequencies, a plurality of AND circuits corresponding in number to the number of control tones in the sequence of control tones and each having first and second inputs and an output, control means for providing at the output thereof a control signal during reception of the first control tone in the sequence of control tones, the output of said control means being coupled to one of the control inputs of said filter means and to the first input of the first of said AND circuits, said filter means being responsive to the application of the control signal from said control means to be tuned to the frequency of said first control tone, means coupling the output of said filter means to the second input of each of said [ first ] AND circuits, said first AND circuit being responsive to the applications thereto of both the control signal from said control means and said first control tone for producing at the output thereof an output signal, a plurality of electronic switching circuits corresponding in number to the number of control tones in the sequence of control tones and each having an input and output, the output of said first AND circuit being coupled to the input of the first of said electronic switching circuits and the output of each succeeding one of said AND circuits being respectively coupled to the input of the next succeeding one of said electronic switching circuits, the output of said first electronic switching circuit being coupled to the first input of [ said first AND circuit ] *the second one of said AND circuits* and the output of each succeeding one of said electronic switching circuits being coupled respectively to the first input of the next succeeding one of said AND circuits, means coupling the outputs of said electronic switching circuits respectively to the control inputs of said filter means, said first electronic switching circuit being responsive to the application thereto of the output signal from said first AND circuit for producing at the output thereof a DC voltage, means coupled to said control means for removing the control signal therefrom after termination of said first control tone, said second AND circuit and each succeeding AND circuit being responsive to the application thereto of both the DC voltage from the next preceding electronic switching circuit and the associated control tone in the sequence of control tones from said filter means for producing at the output thereof [ and ] *an* output signal, said second electronic switching circuit and each succeeding electronic switching circuit being responsive to the application thereto of the output signal from the next preceding AND circuit for producing at the output thereof a DC voltage, the output of said second AND circuit and the output of each succeeding one of said AND circuits being coupled respectively to an input of the next preceding one of said electronic switching circuits to enable each of said electronic switching circuits to continue to produce said DC voltage as long as the associated control tone is being applied to the next succeeding one of said AND circuits, said filter means sequentially being tuned to the frequencies of the control tones as they are received by said input circuit in accordance with the sequential application of said output signals to said control inputs, and means coupling the output of the last of said electronic switching circuits to the DC voltage utilization circuit of the receiver.

32. A tone control circuit for use in a communication receiver including an input circuit which provides a sequence of control tones and including an output signal utilization circuit, said tone control circuit comprising first filter means coupled to the input circuit and including a first frequency, determining element having a plurality of inputs thereto, a plurality of electronic switching devices coupled respectively to the inputs of said first frequency-determining element, second filter means coupled to the input circuit and including a second frequency-determining element having a plurality of inputs thereto, a plurality of electronic switching devices coupled respectively to the inputs of said second frequency-determining element, each of said electronic switching devices being closed by the application thereto of a signal to couple in circuit a portion of the associated frequency-determining element and thereby tune the associated filter means to a predetermined frequency, a plurality of AND circuits corresponding in number to the number of control tones in the sequence of control tones and each having first and second inputs and an output, control means for providing at the output thereof a control signal during reception of the first control tone in the sequence of control tones, the output of said control means being coupled to one of the control inputs of said first filter means and to the first input of the first of said AND circuits, said first filter means being responsive to the application of the control signal from said control means to be tuned to the frequency of said first control tone, means coupling the output of said first filter means to the second input of said first AND circuit and to the second input of each succeeding odd-numbered AND circuit, means coupling the output of said second filter means to the second input of said second AND circuit and to the second input of each succeeding even-numbered AND circuit, said first AND circuit being responsive to the application thereto of both the control signal from said control means and said first control tone for producing at the output thereof an output signal, the output of said first AND circuit and the output of each succeeding AND circuit being coupled respectively to the first input of the next succeeding AND circuits, means coupling the outputs respectively of said first AND circuit and of each succeeding odd-numbered AND circuit respectively to the control inputs of said second filter means, means coupling the outputs respectively of said second AND circuit and of each succeeding even-numbered AND circuit respectively to the control inputs of said first filter means, means coupled to said control means for removing the control signal therefrom after termination of said first control tone, said second AND circuit and each succeeding AND circuit being responsive to the application thereto of both the output signal from the next preceding AND circuit and the associated control tone in the sequence of control tones from the associated filter means for producing at the output thereof an output signal, said first and second filter means alternately being tuned to the frequencies of the control tones as they are received by said input circuit by the sequential application to said control inputs of said output signals, and means coupling the output of the last of said AND circuits to the output signal utilization circuit of the receiver.

33. The tone control circuit set forth in claim 32, wherein each of said frequency-determining elements is a tapped inductor.

34. In a communication receiver for receiving signals including intelligence and a sequence of control tones, a receiver comprising an input circuit which provides the signals including the intelligence and the sequence of control tones, a translating circuit coupled to said input circuit for translating the intelligence into useful form, an output control circuit coupled to said translating circuit and effective in a first condition thereof to render said translating circuit inoperative and effective in a second condition thereof to render said translating circuit operative, filter means coupled to the input circuit and having a plurality of control inputs for receiving one at a time signals selectively to tune said filter means respectively to predetermined frequencies, a plurality of AND circuits corresponding in number to the number of control tones in the sequence of control tones and each having first and second inputs and an output, control means for providing at the output thereof a control signal during reception *of the* first control tone in the sequence of control tones, the output of said control means being coupled to one of the control inputs of said filter means and to the first input of the first of said AND circuits, said filter means being responsive to the application of the control signal from said control means to be tuned to the frequency of said first control tone, means coupling the output of said filter means to the second input of each of said AND circuits, said first AND circuit being responsive to the application thereto of both the control signal from said control means and said first control tone for producing at the output thereof an output signal, the output of said first AND circuit and the output of each succeeding AND circuit being coupled respectively to the first input of the next succeeding AND circuit, means coupling the outputs of said AND circuits respectively to the control inputs of said filter means, means coupled to said control means for removing the control signal therefrom after termination of said first control tone, said second AND circuit and each succeeding AND circuit being responsive to the application thereto of both the output signal from the next preceding AND circuit and the associated control tone in the sequence of control tones from said filter means for producing at the output thereof an output signal, said filter means sequentially being tuned to the frequencies of the control tones as they are received by said input circuit in accordance with the sequential application of said output signals to said control inputs, and means for applying the output signal from the last of said AND circuits to said output control circuit for actuating said output control circuit from the first condition thereof to the second condition thereof so as to render said translating circuit operative.

35. A communication system comprising a transmitter including a tone-generating circuit for generating tones selected from a first group of tones in a first band of frequencies and for generating tones selected from a second group of tones in a second band of frequencies separate and distinct from said first band of frequencies, said tone-generating circuit generating a sequence of control tones alternately selected from said first and second groups of tones, and a transmitter output circuit coupled to said tone-generating circuit for transmitting signals corresponding to the sequence of control tones to be transmitted; and a receiver including an input circuit for receiving the signals from said transmitter, filter means coupled to the input circuit and having a plurality of control inputs for receiving one at a time signals selectively to tune said filter means to predetermined frequencies, a plurality of AND circuits corresponding in number to the number of control tones in the sequence of control tones and each having first and second inputs and an output, control means for providing at the output thereof a control signal during reception of the first control tone in the sequence of control tones, the output of said control means being coupled to one of the control inputs of said filter means and to the first input of the first of said AND circuits, said filter means being responsive to the application of the control signal from said control means to be tuned to the frequency of said first control tone, means coupling the output of said filter means to the second input of each of said AND circuits, said first AND circuit being responsive to the application thereto of both the control signal from said control means and said first control tone for producing at the output thereof an input signal, the output of said first AND circuit and the output of each succeeding AND circuit being coupled respectively to the first input of the next succeeding AND circuit, means coupling the outputs of said AND circuits respectively to the control inputs of said filter means, means coupled to said control means for removing the control signal therefrom after termination of said first control tone, said second AND circuit and each succeeding AND circuit being responsive to the application thereto of both the output signal from the next preceding AND circuit and the associated control tone in the sequence of control tones from said filter means for producing at the output thereof an output signal, said filter means sequentially being tuned to the frequencies of the control tones as they are received by said input circuit in accordance with the sequential application of said output signals to said control inputs, and an output signal utilization circuit coupled to the output of the last of said AND circuit for utilizing the output signal therefrom.

36. A tone control circuit for use in a communication receiver including an input circuit which provides a control tone and including an output signal utilization circuit, said tone control circuit comprising filter means coupled to the input circuit and including a first frequency-determining element having a plurality of taps thereon and a second frequency-determining element, a connector plug including first and second and third portions, said first portion having a plurality of terminals thereon fixedly coupled respectively to the taps on said first frequency-determining element, said second portion having a terminal fixedly coupled to said second frequency-determining element, said third portion having a plurality of first terminals respectively matable with the terminals in said [ first ] *second* portion and having a second terminal matable with the terminal in said [ second ] *first* portion, means associated with said third portion connecting said first terminal to a selected one of said second terminals, whereby mating said third portions with said first and second portions operates to connect a selected section of said first frequency-determining element in circuit with said second frequency-determining element and thereby tune said filter means to the frequency of the control tone, an output circuit coupled to said filter means and responsive to the control tone being coupled therethrough to provide an output signal, and means coupling the output of said output circuit to the output signal utilization circuit of the receiver.

37. The tone control circuit set forth in claim 36, wherein said first frequency-determining element is an inductor and said second frequency-determining element is a capacitor.

38. The tone control circuit set forth in claim 36, wherein said first frequency-determining element is an inductor and said second frequency-determining element is a capacitor, one terminal of said capacitor being fixedly coupled to one terminal of said inductor and said connector plug being operative to connect the other terminal of said capacitor to a tap on said inductor so as to define a parallel resonant circuit.

39. A tone control circuit for use in a communication receiver including an input circuit which provides a sequence of control tones and including an output signal utilization circuit, said tone control circuit comprising filter means coupled to the input circuit and including a first frequency-determining element having a plurality of taps thereon and a second frequency-determining element, a set of electronic switching devices each having a control input and one terminal coupled to said second frequency-determining element, a connector plug including first and second and third portions, said first [ section ] *portion* having a plurality of terminals thereon fixedly coupled respectively to the taps on said first frequency-determining element, said second portion having a corresponding set of terminals respectively fixedly coupled to the other terminals of said electronic switching devices, said third portion having a plurality of first terminals respectively matable with the terminals in said first portion and a set of second terminals respectively matable with the terminals of said [ first ] *second* portion, means associated with said third portion for connecting selected ones of said first terminals respectively to selected ones of said second terminals, whereby mating said third portion with said first and second portions enables said electronic switching devices respectively to couple selected sections of said [ second ] *first* frequency-determining element in circuit with said [ first ] *second* frequency-determining element, an output circuit having an input coupled to said filter means and having a plurality of outputs respectively coupled to the control inputs of said electronic switching devices, said electronic switching devices sequentially being closed by the application of signals from said output circuit to said control inputs sequentially to tune said filter means to the frequencies of the control tones as they are received by the input circuit, and means coupling the output which is responsive to the last tone in the sequence of control tones to the output signal utilization circuit of the receiver.

40. The tone control circuit set forth in claim 39, wherein each of said electronic switching devices is a transistor means having a base which is said control input and a pair of output electrodes in the form of a collector and an emitter, one of said output electrodes being coupled to the associated tap and the other of said output electrodes being coupled to said second frequency determining element.

*41. A selective receiver for indicating the presence of a predetermined tone grouping in tone encoded paging signals comprising electric filter means sequentially tunable to pass individual tones of said grouping in a predetermined order, means for detecting said tone encoded signals and coupling same to the input of said filter means, sequence detector means coupled to the output of said filter means and arranged to cause said filter means to pass sequentially in said predetermined order the tones of said grouping upon the prior passage of preceding tones of said tone grouping, and indicator means responsive only to the passage through said filter means of the last of the tones of said grouping for indicating said receiver is being paged.*

*42. A selective receiver as in claim 41 wherein said sequence detector means includes counter means responsive to the output of said filter means for counting the number of tones passed through said filter means and for actuating said indicator means when a number corresponding to the number of tones in said tone grouping is counted.*

*43. A selective receiver as in claim 41 wherein said filter means is controllable to selectively pass distinct individual tones, and further including sequence control means responsive to said sequence detector means for controlling said filter means to sequentially pass tones in said predetermined order.*

*44. A selective receiver as in claim 43 wherein said sequence control means is coupled to said filter means to quiescently tune said filter means to pass the first tone of said predetermined order and wherein said sequence detector means includes counter means responsive to the output of said filter means for counting the number of tones passed and for actuating said indicator means when all tones of said grouping are counted.*

*45. A selective receiver as in claim 44 wherein said counter means includes monostable multivibrator means and register means, each coupled to the output of said filter means, said monostable multivibrator means being responsive to at least the first tone passed through said filter means for operating said sequence control means and causing said filter means to tune to the second tone in said grouping, and said register means being arranged to be nonresponsive to said first tone pulse and to count the remaining tones in said sequence.*

*46. A selective receiver as in claim 45 wherein said counter means includes gate means coupled to the outputs of said filter means and of said monostable multivibrator means for rendering said register means nonresponsive to said first tone of said predetermined order and responsive to all succeeding tones of said grouping.*

*47. A selective receiver according to claim 41 wherein said sequence control means includes means for successively connecting said filter means to different impedance terminals for causing said filter means to pass different tones and means for separately changing the impedance applied to each terminal for changing the coding of said receiver.*

*48. A selective receiver according to claim 41 wherein said sequence detector means is responsive to the prior passage of a tone by said electric filter means to connect said electric filter means to a different tuning impedance terminal in said predetermined order and wherein said sequence detector means further includes an impedance device capable of providing at each of several connecting points, greater in number than said tuning impedance terminals, a different impedance and connection means for selectively connecting each of said tuning impedance terminals to different ones of said connection points.*

*49. A selective receiver for indicating the presence of a predetermined frequency grouping in frequency encoded paging signals comprising: electric filter means controllable to selectively pass individual frequencies of said grouping, means for detecting said frequency encoded signals and coupling same to the input of said filter means, sequence control means coupled to said filter means for tuning same to sequentially pass frequencies in a predetermined order, sequence detector means connected to the output of said filter means for detecting the passage of the frequencies in said grouping, and indicator means responsive only to the last output of said sequence detector means for indicating said receiver is being paged, said sequence control means being coupled to the output of said filter means for operation in response to the outputs thereat.*

*50. A selective receiver as in claim 49 wherein said sequence control means is preset to cause said filter means to pass the first frequency in said predetermined order and to pass successively the succeeding frequencies in said predetermined order upon the passage of their preceding frequency.*

*51. A selective receiver as in claim 50 wherein said sequence control means is constructed to return to its preset condition after at least one subsequent frequency of a detected encoded frequency grouping fails to pass through said filter means.*

*52. A selective receiver as in claim 50 wherein said sequence control means is operable in response to said sequence detector means to cause said sequential tuning of said filter means.*

*53. A selective receiver as in claim 52 wherein said sequence detector means includes counter means responsive to the output of said filter means for counting the number of distinct frequencies passed and for actuating said indicator means.*

*54. A selective receiver as in claim 53 wherein said sequence control means is reset by said counter means.*

*55. A selective receiver as in claim 54 wherein said sequence control means is operable to cause said sequential tuning of said filter means in response to said counter means.*

*56. A selective receiver as in claim 55 wherein said counter means includes monostable multivibrator means and register means, said monostable multivibrator means being responsive to at least the first frequency output of said filter means, for operating said sequence control means and causing said filter means to tune to the second*

*frquency of said predetermined order, and said counter circuit being arranged to be nonresponsive to said first frequency and to count the remaining frequencies of said predetermined order.*

*57. A selective receiver as in claim 56 wherein said sequence control circuit is controlled and reset by both said monostable multivibrator means and said counter circuit means.*

*58. A selective receiver for indicating the presence of a predetermined tone grouping in tone encoded paging signals comprising: active electric filter means arranged to have its bandpass range tunable in accordance with external circuit means, a plurality of external circuit means each arranged to be separately coupled to said active filter and to tune its bandpass range to pass different tones of said grouping, means for detecting said tone encoded signals and for coupling same to the input of said active filter means, sequence control means arranged to sequentially connect each of said plurality external circuit means to said active filter to cause said active filter to sequentially pass tones in a predetermined order, sequence detector means connected to the output of said active filter means for detecting the passage of the tones in said grouping in said predetermined order and indicator means responsive only to the last output of said sequence detector means for indicating that said receiver is being paged.*

*59. A selective receiver as in claim 58 wherein said active filter means is constructed to have its bandpass range varied in response to externally connected impedance means, and wherein each of said external circuit means comprises impedance means for tuning said active filter means to pass a distinct tone of said tone grouping.*

*60. A selective receiver as in claim 59 wherein said paging signals are sequential tone encoded signals and said predetermined order is the order in which said tones occur in said grouping and wherein said sequence control means comprises switch means for individually coupling each of said impedance means to said active filter means in a sequential manner to pass tones in the sequence which the tones occur in said grouping.*

*61. A selective receiver as in claim 60 wherein said switch means is coupled to the output of said active filter means and are operable in response thereto.*

*62. A selective receiver as in claim 61 wherein said switch means is preset to cause said active filter means to pass the first tone of said grouping and to pass the succeeding tones of said grouping upon the passage of the preceding tones of said grouping.*

*63. A selective receiver as in claim 62 wherein said switch means is constructed to return to its preset condition after at least one subsequent tone of a detected tone encoded grouping fails to pass through said filter means.*

*64. A selective receiver as in claim 60 wherein said switch means is coupled to said sequence detector means and is operable in response thereto to cause said sequential tuning of said filter means.*

*65. A selective receiver as in claim 64 wherein said sequence detector means includes counter means responsive to the output of said active filter means for actuating said indicator means.*

*66. A selective receiver as in claim 65 wherein said switch means is coupled to said counter means to be controlled and reset thereby.*

*67. A selective receiver as in claim 66 wherein said counter means includes monostable multivibrator means and register means, said monostable multivibrator means being responsive to at least the first tone output of said active filter means, for operating said sequence control means and for causing said active filter means to tune to the second tone in said grouping, and said register means being arranged to be nonresponsive to said first tone pulse and to count the remaining tones in said grouping.*

*68. A selective receiver as in claim 67 wherein said switch means is coupled to said monostable multivibrator means and is arranged to switch from its preset condition to cause said active filter means to pass the second tone of said grouping and wherein said switch means is coupled to said register means to cause said active filter means to pass the remaining tones in said grouping.*

*69. A method of receiving and indicating the presence of a predetermined tone grouping in tone encoded paging signals comprising detecting said tone encoded paging signals, passing said tone encoded signals through an electric filter arranged to pass only the first tone of said grouping, thereafter sequentially retuning said filter to pass the remaining tones in said grouping in the sequence in which they are arranged in said grouping, and causing an output indication only upon the passage of all of said tones in said grouping through said filter.*

*70. A method of receiving and indicating the presence of a predetermined tone grouping as in claim 69 including the step of counting the number of tones passed through said filter and causing said indication upon the counting of the total number of tones in said grouping.*

*71. A method of receiving and indicating the presence of a predetermined tone grouping as in claim 69 wherein said filter comprises an active filter arranged to have its bandpass range tuned in accordance with a plurality externally connected circuit means, and wherein the sequential retuning of said active filter is carried out by sequentially connecting each of said plurality of circuit means to said active filter to cause said filter to pass tones in the sequence in which they occur in said grouping.*

*72. A decoder for determining the presence of an n tone grouping in tone encoded paging signals, wherein n corresponds to the number of tones in said grouping, comprising: an active electric filter arranged to have its bandpass tuned in accordance with external impedance means, n impedance means each arranged to tune said active filter to pass separately the different tones of said tone grouping, n switch means for coupling each of said plurality of impedance means to said active filter, and gate means arranged to operate said n switch means in response to the output of said active filter to cause said active filter to sequentially pass tones in the sequence in which the tones are arranged in said grouping, counter means coupled to the output of said active filter for counting the tones passed through said active filter and providing an actuating output only upon the passage through said active filter of n tones whereby presence of an actuating output at said counter means indicates presence of said predetermined tone grouping.*

*73. A decoder as in claim 72 and wherein said n switch means are sequentially operated in response to said counter means.*

*74. A decoder as in claim 72 wherein said n tone grouping is made up of tones selected from m tones and wherein said n impedance means are selected from a group of m impedance means each arranged to tune said active filter to pass a different one of said m tones and connector means for separately connecting selected ones of said m impedance means to said n switch means, said selected impedance means being arranged to tune said active filter to pass separately the different tones of said tone grouping.*

*75. A selective receiver for indicating the presence of a predetermined modulation grouping in modulation encoded paging signals comprising: modulation selection means sequentially adjustable to pass individual tones of said grouping in a predetermined order, means for detecting said modulation encoded signals and coupling same to the input of said modulation selection means, sequence detector means coupled to the output of said modulation*

*selection means and arranged to cause said modulation selection means to pass sequentially in said predetermined order the modulations of said grouping upon the prior passage of preceding modulations of said grouping, and indicator means responsive to the passage through said modulation selection means of all the modulations of said grouping for indicating said receiver is being paged.*

* * * * *

UNITED STATES PATENT OFFICE

CERTIFICATE OF CORRECTION

PATENT NO. : Re. 28,739

DATED : March 16, 1976

INVENTOR(S) : Keith H. Wycoff

It is certified that error appears in the above-identified patent and that said Letters Patent are hereby corrected as shown below:

Column 4, line 1, "1533" should be --1553--.
Column 5, line 52, "and" should be deleted.
Column 6, line 15, "of" first occurrence should be --a--;
line 61, "filter" should be --filters--.
Column 7, line 60, "235" second occurrence should be --233--.
Column 10, line 68, "control" should be --contact--.
Column 11, line 51, "chamber" should be --conductor--.
Column 12, line 31, "condution" should be --conduction--.
Column 15, line 26, "desccribed" should be --described--.
Column 17, line 67, "conduc-"should be --condi- --.
Column 20, line 27, "837C" should be --873C--.
Column 21, line 19, "605" should be --665--.
Column 36, line 13, the brackets should be deleted;
"*second*" should be deleted;
line 15, the brackets should be deleted;
"*first*" should be deleted;
line 16, brackets should be placed around "*first*";
--*second*-- should be inserted after "first";
line 17, brackets should be placed around "second";
--*first*-- should be inserted after "second".
Column 38, line 3, "*41*" should be --*43*--.
Column 39, line 1, "*frquency*" should be --*frequency*--.

Signed and Sealed this

Nineteenth Day of October 1976

[SEAL]

*Attest:*

RUTH C. MASON
*Attesting Officer*

C. MARSHALL DANN
*Commissioner of Patents and Trademarks*